(12) United States Patent
Kawauchi et al.

(10) Patent No.: US 9,706,673 B2
(45) Date of Patent: *Jul. 11, 2017

(54) MANUFACTURING METHOD OF ELECTRONIC DEVICE, ELECTRONIC DEVICE, ELECTRONIC APPARATUS, MOVING OBJECT, AND LID BODY

(71) Applicant: Seiko Epson Corporation, Tokyo (JP)

(72) Inventors: Osamu Kawauchi, Shiojiri (JP); Shinya Aoki, Minowa (JP); Juichiro Matsuzawa, Minowa (JP); Masaru Mikami, Kochi (JP)

(73) Assignee: Seiko Epson Corporation (JP)

( * ) Notice: Subject to any disclaimer, the term of this patent is extended or adjusted under 35 U.S.C. 154(b) by 91 days.

This patent is subject to a terminal disclaimer.

(21) Appl. No.: 14/527,947

(22) Filed: Oct. 30, 2014

(65) Prior Publication Data

US 2015/0116951 A1 Apr. 30, 2015

(30) Foreign Application Priority Data

Oct. 31, 2013 (JP) ................................. 2013-226527

(51) Int. Cl.
*H05K 5/06* (2006.01)
*B23K 1/00* (2006.01)
(Continued)

(52) U.S. Cl.
CPC ........... *H05K 5/066* (2013.01); *B23K 1/0016* (2013.01); *B23K 11/06* (2013.01); *B23K 26/244* (2015.10); *B23K 28/02* (2013.01); *G01C 19/5783* (2013.01); *H03H 9/0552* (2013.01); *H03H 9/1014* (2013.01); *H03H 9/1071* (2013.01);
(Continued)

(58) Field of Classification Search
CPC ..... H05K 5/066; H05K 5/0239; B23K 26/244
See application file for complete search history.

(56) References Cited

U.S. PATENT DOCUMENTS 2,453,061 A 11/1948 Bissout
4,596,688 A * 6/1986 Popp .......................... G21F 5/12
220/612

(Continued)

FOREIGN PATENT DOCUMENTS

JP 01-151813 6/1989
JP 2000223604 A 8/2000
(Continued)

*Primary Examiner* — Hoa C Nguyen
*Assistant Examiner* — Keith Depew
(74) *Attorney, Agent, or Firm* — Harness, Dickey & Pierce, P.L.C.

(57) ABSTRACT

A manufacturing method of an electronic device, that accommodates a gyro element as an electronic component in an inner space formed by a base and a lid as a lid body, includes: preparing the lid in which a groove is provided on the rear surface which is welded with the base, and an opening area of the groove on the inner space side which is greater than an opening area on the outer periphery side of the lid; welding, first, the base and the lid at a portion excluding an unwelded portion that includes at least apart of the groove, of a planned welding portion of the base and the lid; and welding, second, the base and the lid at the unwelded portion such that the groove is closed.

18 Claims, 13 Drawing Sheets

(51) Int. Cl.
*H05K 5/02* (2006.01)
*B23K 11/06* (2006.01)
*B23K 28/02* (2014.01)
*H03H 9/05* (2006.01)
*H03H 9/10* (2006.01)
*B23K 26/244* (2014.01)
*G01C 19/5783* (2012.01)
*B23K 101/40* (2006.01)

(52) U.S. Cl.
CPC ........ *H05K 5/0239* (2013.01); *B23K 2201/40* (2013.01); *H01L 2224/16225* (2013.01); *H01L 2924/16195* (2013.01)

(56) References Cited

U.S. PATENT DOCUMENTS

| | | | | |
|---|---|---|---|---|
| 6,059,171 | A * | 5/2000 | Yamanaka | B62M 3/00 228/125 |
| 6,085,964 | A * | 7/2000 | Hojo | H01H 1/66 228/127 |
| 6,199,259 | B1 | 3/2001 | Demaray et al. | |
| 6,267,289 | B1 | 7/2001 | Miola | |
| 8,408,873 | B2 * | 4/2013 | Iwasa | B23K 26/206 29/525.14 |
| 8,804,316 | B2 | 8/2014 | Shiraki et al. | |
| 9,291,457 | B2 | 3/2016 | Aoki et al. | |
| 2007/0090516 | A1 * | 4/2007 | White | C23C 16/4586 257/704 |
| 2008/0229580 | A1 * | 9/2008 | Anderson | B23K 1/0012 29/890.03 |
| 2008/0251345 | A1 * | 10/2008 | Zahner | B23K 9/02 192/112 |
| 2009/0224530 | A1 | 9/2009 | Sessions | |
| 2009/0270795 | A1 * | 10/2009 | Elmouelhi | A61M 5/14216 604/27 |
| 2010/0224973 | A1 | 9/2010 | Han | |
| 2012/0308378 | A1 * | 12/2012 | Kobayashi | B23K 9/0286 415/214.1 |
| 2014/0146451 | A1 * | 5/2014 | Aoki | H03H 9/1014 361/679.01 |
| 2014/0211384 | A1 * | 7/2014 | Aoki | H05K 5/066 361/679.01 |
| 2015/0130548 | A1 * | 5/2015 | Matsuzawa | H05K 5/0239 331/154 |
| 2015/0315668 | A1 * | 11/2015 | Nakagawa | C21D 9/40 464/106 |
| 2016/0011029 | A1 * | 1/2016 | Arai | B29C 66/81267 73/273 |

FOREIGN PATENT DOCUMENTS

| | | |
|---|---|---|
| JP | 2002359311 A | 12/2002 |
| JP | 2004-320150 A | 11/2004 |
| JP | 2013015419 A | 1/2013 |
| JP | 2013016657 A | 1/2013 |
| JP | 2013016659 A | 1/2013 |
| JP | 2014106016 A | 6/2014 |
| JP | 2014107316 A | 6/2014 |
| JP | 2014107317 A | 6/2014 |

* cited by examiner

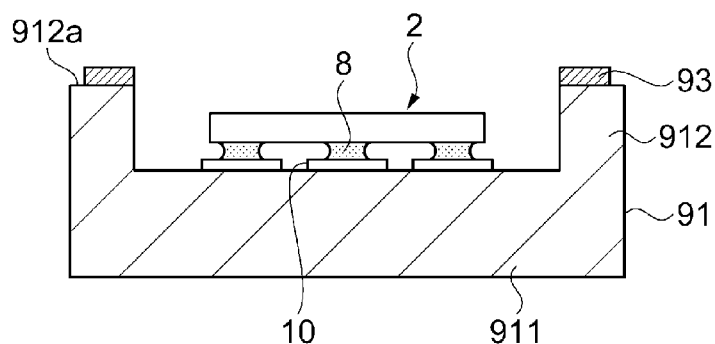
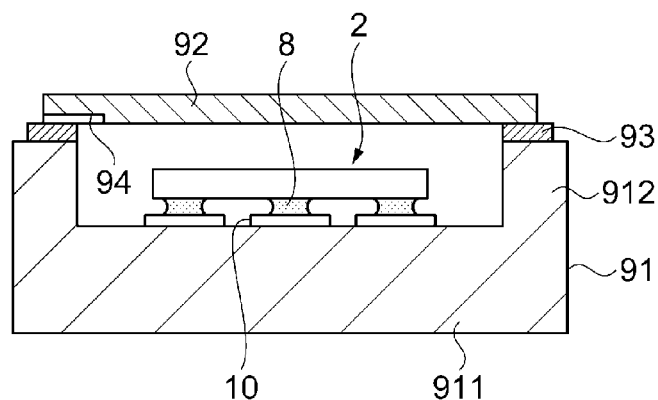
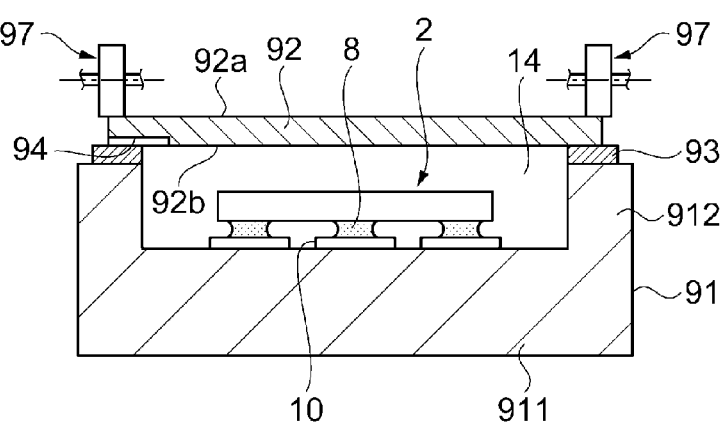
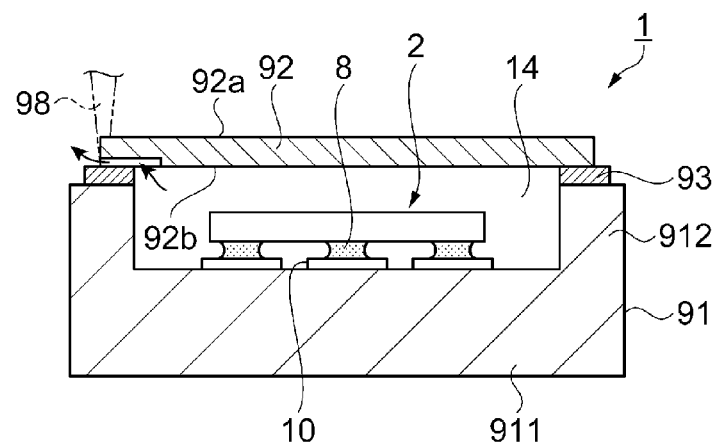

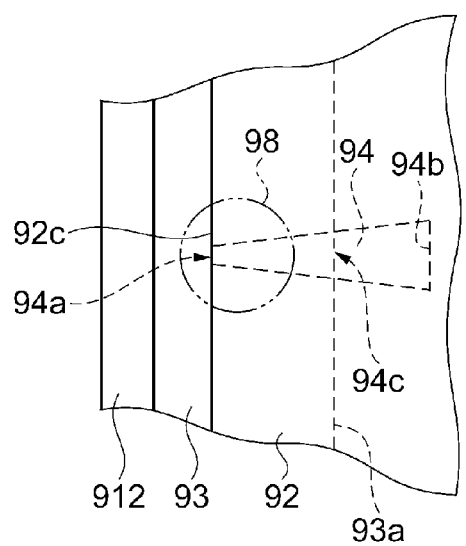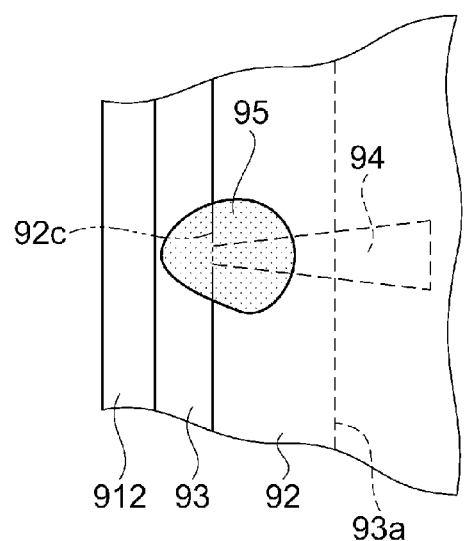
FIG. 6A    FIG. 6C
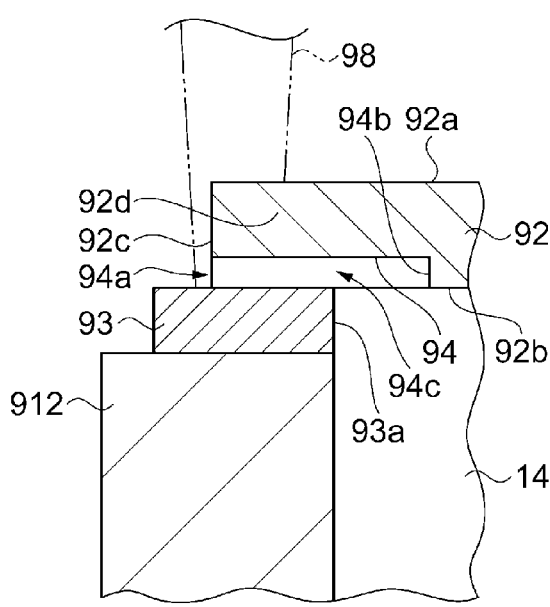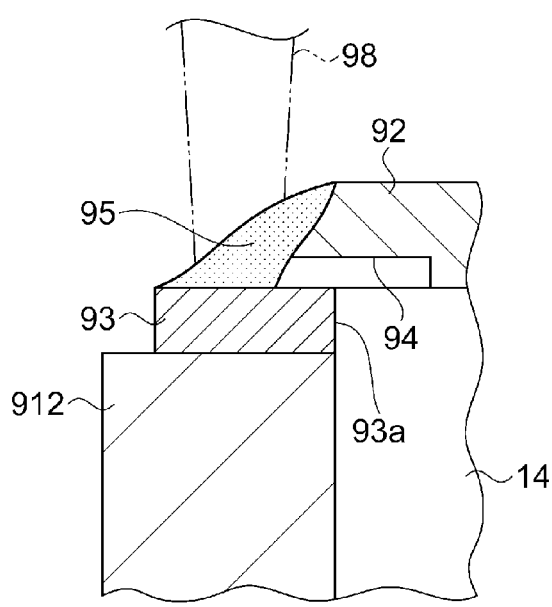
FIG. 6B    FIG. 6D

MANUFACTURING METHOD OF ELECTRONIC DEVICE, ELECTRONIC DEVICE, ELECTRONIC APPARATUS, MOVING OBJECT, AND LID BODY

BACKGROUND

1. Technical Field

The present invention relates to a manufacturing method of an electronic device, an electronic device, an electronic apparatus, a moving object, and a lid body.

2. Related Art

Recently, portable electronic apparatuses are widely used, and thus reduction in size, weight, and cost of the electronic apparatuses is highly desired. Therefore, reduction in size and cost of an electronic component used in the electronic apparatus is highly required, while accurate performance is maintained. Particularly, in a vibration device that accommodates a vibration element in a package, a space to accommodate the vibration element needs to be maintained to be air-tight, which causes vibration characteristics to be maintained. Therefore, various sealing techniques are proposed.

For example, a manufacturing method of a miniaturized quartz crystal vibrator disclosed in JP-A-1-151813 includes forming a notch on a package surface on which a lid (lid body) is joined, and a metal brazing material is melted at a portion except for the notch portion such that the lid and the package are joined. Degassing is performed through the notch portion that is not joined, and then melting of a metal brazing material on the notch portion is secondarily performed such that the lid body and the package are sealed.

However, in the joining method described above, great melting energy is needed to perform the second melting of the metal brazing material at the notched portion such that the lid body and the package are sealed, and there is a concern that the melting energy causes a minute crack on the package. The minute crack on the package causes a minute leakage in the air-tight seal, and thus characteristics of an electronic component, such as a vibration element, which is accommodated therein, deteriorate.

SUMMARY

An advantage of some aspects of the invention is to solve at least a part of the problems described above, and the invention can be implemented as the following forms or application examples.

Application Example 1

This application example is directed to a manufacturing method of an electronic device that accommodates an electronic component in an inner space formed by a base and a lid body. The manufacturing method includes: preparing the lid body in which a groove is provided on a surface which is welded with the base, and an opening area of the groove on the inner space side is greater than an opening area on the outer circumferential side of the lid body; welding, first, the base and the lid body at a portion excluding an unwelded portion that includes at least a part of the groove, of a scheduled welding portion of the base and the lid body, in a state in which the inner space communicates with the outside through the groove; and welding, second, the base and the lid body at the unwelded portion such that the groove is closed.

According to the manufacturing method of an electronic device, the groove of the lid body is provided to have a greater opening area on the inner space side (central side) than the opening area on the outer circumferential side thereof. That is, since the opening area of the groove on the outer circumferential side is small, it is possible to close the groove by a small melting portion in the second welding. Since such a small melting portion may be formed, it is possible to reduce melting energy, and it is possible to suppress damage to the base. Accordingly it is possible to prevent a defect, such as a minute crack, from being produced on the base, and it is possible to suppress characteristic deterioration in an accommodated electronic component, such as a vibration element. The base is included in the package. In addition, the welding of the base and the lid body in the first welding can be performed with a direct welding method of the base and the lid body, or a welding method in which another joining member, such as a metal member, is provided between the base and the lid body, and the welding is performed through the joining member.

Application Example 2

In the manufacturing method of an electronic device according to the application example described above, it is preferable that the manufacturing method further includes: exhausting air from the inner space through the groove between the first welding and the second welding.

In the configuration described above, the inner space communicates with the outside through the groove provided on the lid body, and thus it is possible to easily perform pressure reduction of the inner space or to easily make the inner space an inert gas atmosphere. The gas in the inner space is expelled between the first welding and the second welding, and the groove at the communicating portion is closed by welding. Accordingly, it is possible to seal the inner space in which the pressure reduction is performed or which has the inert gas atmosphere. Therefore, it is possible to perform sealing after the gas produced during welding of the lid body is removed from the inside of the package, and thus it is possible to realize high-quality air-tight sealing with a simplified manufacturing process.

Application Example 3

In the manufacturing method of an electronic device according to the application example described above, it is preferable that the opening area of the groove is continuously increased from the outer circumferential side toward the inner space side.

Application Example 4

In the manufacturing method of an electronic device according to the application example described above, it is preferable that the opening area of the groove is increased in a stepwise manner from the outer circumferential side toward the inner space side.

Application Example 5

In the manufacturing method of an electronic device according to the application example described above, it is preferable that the groove is deeper on the inner space side than on the outer circumferential side.

Application Example 6

In the manufacturing method of an electronic device according to the application example described above, it is preferable that the groove has a greater width on the inner space side than on the outer circumferential side.

When the lid body having the configuration described in any one of Application Examples 3 to 6 is used, it is possible to decrease the opening area of the groove provided on the lid body on the outer circumferential side. Accordingly, it is possible to close the groove with the small melting portion in the second welding, then it is possible to restrain the melting energy, and it is possible to suppress damage to the base. Accordingly, it is possible to prevent a defect, such as a minute crack, from being produced on the base, and it is possible to suppress the characteristic degradation of the accommodated electronic components, such as the vibration element.

Application Example 7

This application example is directed to an electronic device manufactured using the manufacturing method according to the application example described above.

According to the electronic device, it is possible to provide an electronic device in which damage to the base during welding (sealing) is suppressed, and it is possible to suppress the characteristic degradation of the electronic component due to the damage to the base, and which has stable characteristics.

Application Example 8

This application example is directed to an electronic apparatus including an electronic device that is manufactured using the manufacturing method according to the application example described above.

According to the electronic apparatus, it is possible to provide an electronic apparatus that is high in reliability because the electronic device is used, in which damage to the base during welding (sealing) is suppressed, and the characteristic degradation of the electronic component due to the damage to the base is suppressed.

Application Example 9

This application example is directed to a moving object including an electronic device that is manufactured using the manufacturing method according to the application example described above.

According to the moving object, it is possible to provide a moving object that is high in reliability because the electronic device is used, in which damage to the base during welding (sealing) is suppressed, and the characteristic degradation of the electronic component due to the damage to the base is suppressed.

Application Example 10

This application example is directed to a lid body that is welded with a base to form an inner space. A groove is provided on a surface of the lid body, which is welded with the base. A portion excluding an unwelded portion that includes at least a part of the groove of a scheduled welding portion with the base is welded with the base, and an opening area of the groove on the inner space side is greater than an opening area of the groove on the circumferential side of the lid body.

According to the lid body, since the opening area of the groove on the outer circumferential side is smaller than on the inner space side, it is possible to close (seal) the groove with a small melting portion, and it is possible to use less of the melting energy. Therefore, it is possible to suppress damage to the base. Accordingly, it is possible to prevent defects, such as a minute crack, from being produced on the base, and it is possible to achieve a highly reliable air-tight inner space. The base is included in the package.

BRIEF DESCRIPTION OF THE DRAWINGS

The invention will be described with reference to the accompanying drawings, wherein like numbers reference like elements.

FIG. 2A is a plan view, and FIG. 2B is a front cross-sectional view.

FIG. 4A is a plan view, and FIG. 4B is a front cross-sectional view.

FIGS. 5A to 5D are front cross-sectional views illustrating an outline of a manufacturing process of the vibrator as the electronic device.

FIGS. 6A to 6D are views illustrating a sealing process. FIG. 6A is a plan view illustrating a correlation between a groove and an energy ray, FIG. 6B is a front cross-sectional view of FIG. 6A, FIG. 6C is a plan view of the sealing portion, and FIG. 6D is a front cross-sectional view of FIG. 6C.

FIG. 8A is a plan view, FIG. 8B is a side view illustrating an opening of the groove on the outer circumferential side, and FIG. 8C is a front cross-sectional view of FIG. 8A.

DESCRIPTION OF EXEMPLARY EMBODIMENTS

Hereinafter, a manufacturing method of an electronic device according to the invention is described in detail with reference to the drawings.

First Embodiment of Electronic Device

First, an embodiment of a vibrator is described as a first embodiment of an electronic device that is manufactured, to which the manufacturing method of an electronic device according to the invention is applied.

Figure 1:
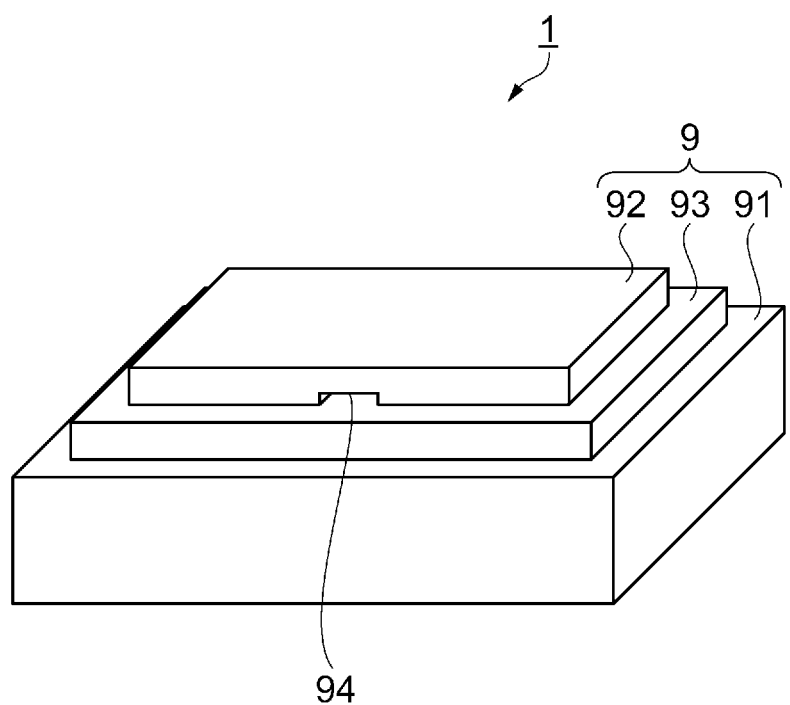
FIG. 1 is a perspective view schematically illustrating a vibrator as a first embodiment of an electronic device.
Figure 2A:
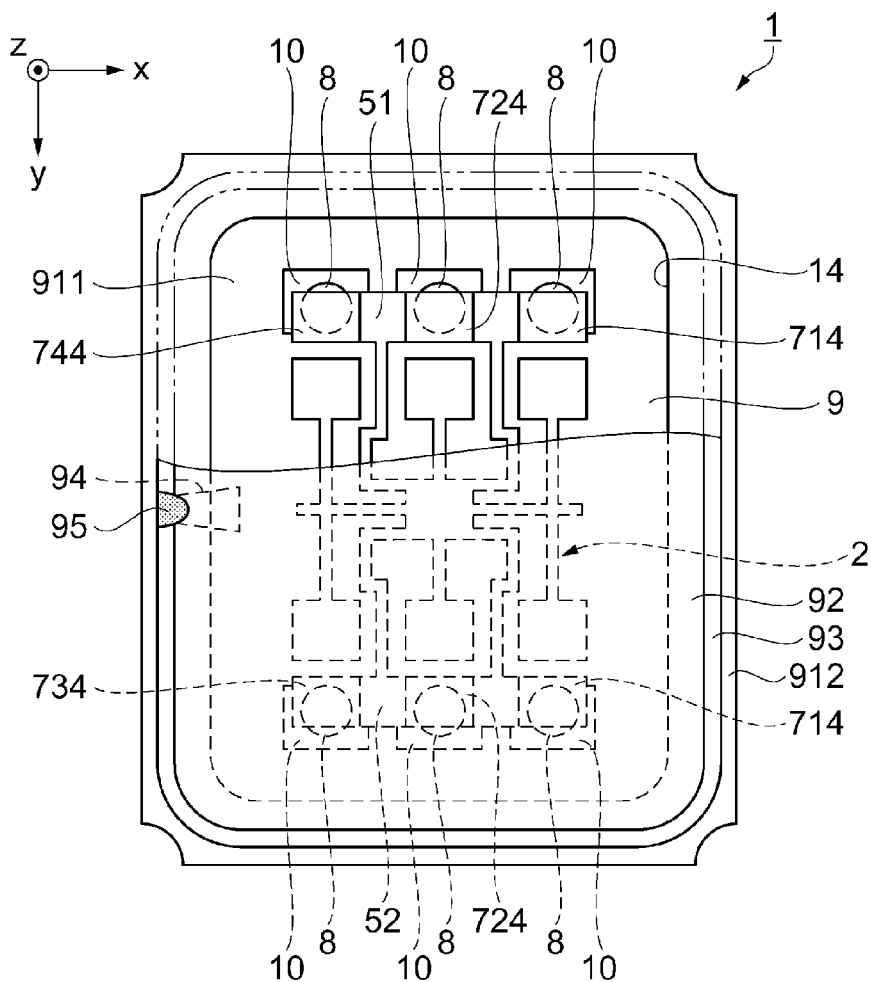
FIGS. 2A and 2B are views schematically illustrating the vibrator as the first embodiment of the electronic device.
Figure 2B:
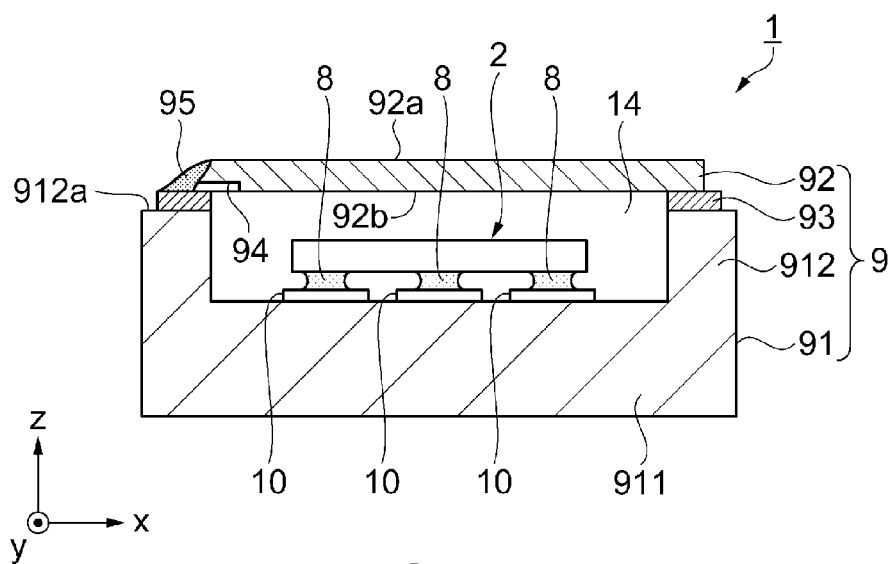
Figure 3:
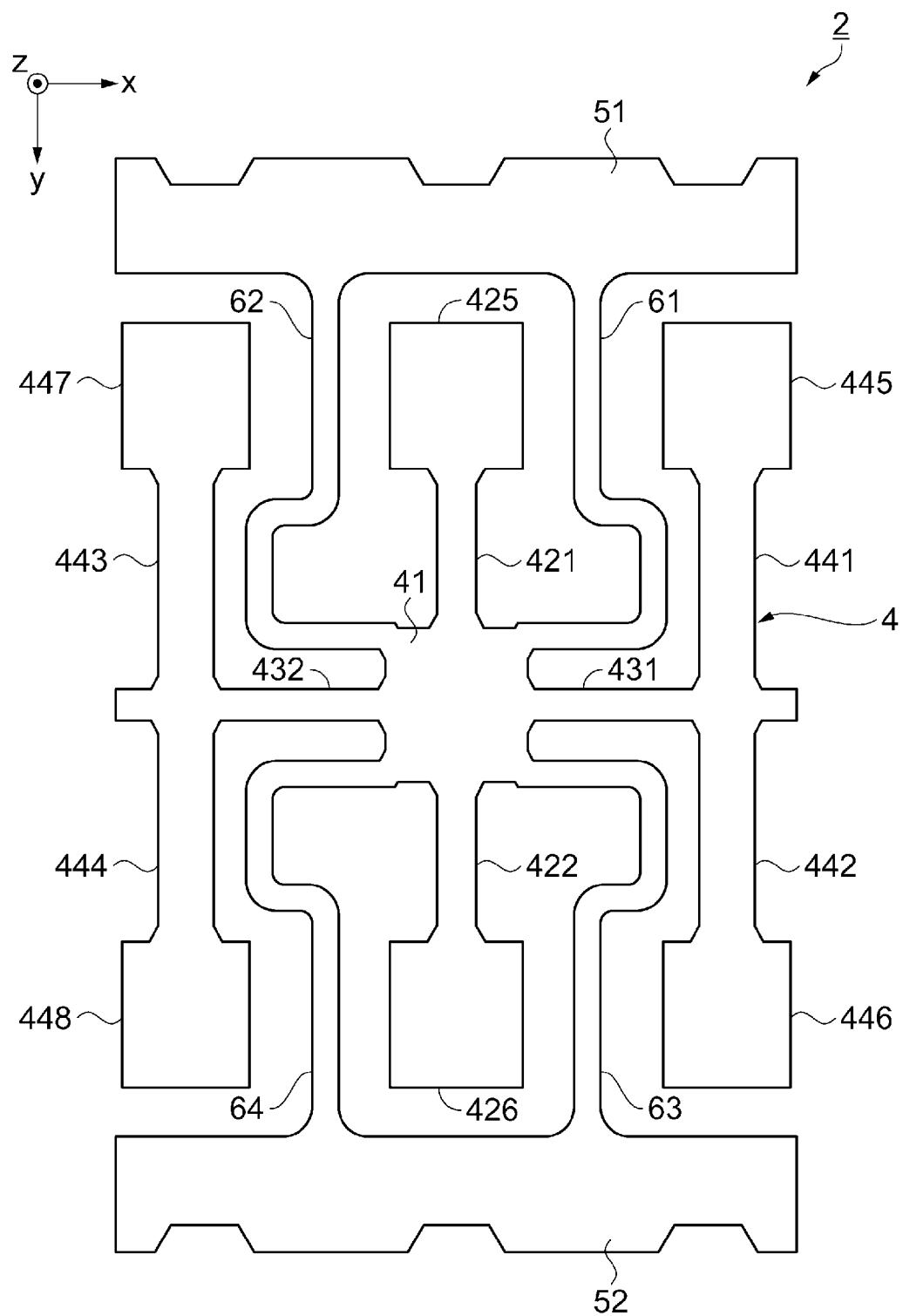
FIG. 3 is a plan view illustrating a gyro element as an electronic component that is used in the electronic device.

FIG. 1 is a perspective view schematically illustrating the vibrator as the first embodiment of the electronic device according to the invention. FIGS. 2A and 2B are views schematically illustrating the vibrator as the first embodiment of the electronic device according to the invention. FIG. 2A is a plan view, and FIG. 2B is a front cross-sectional view. FIG. 3 is a plan view illustrating a gyro element as an electronic component that is included in the vibrator illustrated in FIGS. 2A and 2B. From here on, as illustrated in FIGS. 2A and 2B, three axes orthogonal to each other are an x axis, a y axis, and a z axis, and the z axis matches the thickness direction of the vibrator. In addition, a direction parallel to the x axis is referred to as "x axial direction", a direction parallel to the y axis is referred to as "y axial direction", and a direction parallel to the z axis is referred to as "z axial direction".

A vibrator 1 as an example of the electronic device illustrated in FIGS. 1 to 2B includes a gyro element (vibration element) 2 as an electronic component, and a package 9 that accommodates the gyro element 2 in an inner space 14. Hereinafter, the gyro element 2 and the package 9 are sequentially described in detail. In the package 9 illustrated in FIG. 1, a base 91, a seam ring 93 as a joining material, and a lid 92 as the lid body are included. FIG. 1 illustrates a groove 94 provided on the lid 92, and illustrates a state in which sealing (sealing process) described later is not performed.

Gyro Element

FIG. 3 is a plan view of the gyro element viewed from the top side (z axial direction in FIGS. 2A and 2B that is the lid 92 side described later). On the gyro element, a detection signal electrode, a detection signal wiring, a detection signal terminal, a detection grounding electrode, a detection grounding wiring, a detection grounding terminal, a drive signal electrode, a drive signal wiring, a drive signal terminal, a drive grounding electrode, a drive grounding wiring, a drive grounding terminal, and the like are provided, but are not illustrated in FIG. 3.

The gyro element 2 is an "out-of-plane detection type" sensor that detects an angular velocity about the z axis, and is configured to have a base material, and a plurality of electrodes, wirings, and terminals, that are provided on the front surface of the base material, which are not illustrated. The gyro element 2 can be configured of a piezoelectric material, such as a quartz crystal, lithium tantalite, or lithium niobate, with the quartz crystal being preferable. Accordingly, the gyro element 2 is obtained, in which good vibration characteristics (frequency characteristics) can be exhibited.

Such a gyro element 2 includes a vibration body 4 that has a so-called double T shape, a first support 51 and a second support 52 as supports that support the vibration body 4, and a first beam 61, a second beam 62, a third beam 63, and a fourth beam 64 as beams that connect the vibration body 4 and the first and second supports 51 and 52.

The vibration body 4 extends on an x-y plane, and has thickness in the z axial direction. Such a vibration body 4 includes a base section 41 that is positioned at the center, a first detecting vibration arm 421 and a second detecting vibration arm 422 that extend toward opposite sides along the y axial direction from the base section 41, a first connection arm 431 and a second connection arm 432 that extend toward opposite sides along the x axial direction from the base section 41, a first drive vibration arm 441 and a second drive vibration arm 442 as vibration arms that extend toward opposite sides along the y axial direction from the tip of the first connection arm 431, and a third drive vibration arm 443 and a fourth drive vibration arm 444 as vibration arms that extend toward opposite sides along the y axial direction from the tip of the second connection arm 432. Weight portions (hammer heads) 425, 426, 445, 446, 447, and 448, as wide portions having substantially a rectangular shape with a width greater than the base end section side, are provided on the tips of the first and second detecting vibration arms 421 and 422 and the first, second, third, and fourth drive vibration arms 441, 442, 443, and 444, respectively. Such weight portions 425, 426, 445, 446, 447, and 448 are provided, and thus detection sensitivity of angular velocity of the gyro element 2 is improved.

In addition, the first and second supports 51 and 52 extend along the x axial direction, respectively, and the vibration body 4 is positioned between the first and second supports 51 and 52. In other words, the first and second supports 51 and 52 are disposed to face each other with the vibration body 4 interposed therebetween along the y axial direction. The first support 51 is connected to the base section 41 through the first beam 61 and the second beam 62, and the second support 52 is connected to the base section 41 through the third beam 63 and the fourth beam 64.

The first beam 61 passes between the first detecting vibration arm 421 and the first drive vibration arm 441, and connects the first support 51 and the base section 41. The second beam 62 passes between the first detecting vibration arm 421 and the third drive vibration arm 443, and connects the first support 51 and the base section 41. The third beam 63 passes between the second detecting vibration arm 422 and the second drive vibration arm 442, and connects the second support 52 and the base section 41. The fourth beam 64 passes between the second detecting vibration arm 422 and the fourth drive vibration arm 444, and connects the second support 52 and the base section 41.

Since the respective beams 61, 62, 63, and 64 are formed in an elongated shape extending along the y axial direction in which a meandering part going and returning along the x axial direction is included, the beams have elasticity in every direction. Therefore, even when a force is imposed from an external factor, the respective beams 61, 62, 63, and 64 have an action by which to absorb the impact. Therefore, it is possible to decrease detection noise due to the impact.

The gyro element 2 having such a configuration detects angular velocity ω about the z axis, as follows. In the gyro element 2, when an electric field is produced between the drive signal electrode (not illustrated) and the drive grounding electrode (not illustrated) in a state where the angular velocity ω is not applied, the respective drive vibration arms 441, 442, 443, and 444 perform a bending vibration in the x axial direction. At this time, since the first and second drive vibration arms 441 and 442 and the third and fourth drive vibration arms 443 and 444 performs a plane symmetrical vibration with respect to a y-z plane that passes through a center point (center of gravity), the base section 41, the first and second connection arms 431 and 432, and the first and second detecting vibration arms 421 and 422 do not vibrate at all.

When the angular velocity ω is applied to the gyro element 2 about the z axis in a state in which the drive vibration is performed, a Coriolis' force in the y axial direction acts on the respective drive vibration arms 441, 442, 443, and 444 and the connection arms 431 and 432 and, in response to the vibration in the y axial direction, the detection vibration in the x axial direction is excited. The detection signal electrode (not illustrated) and the detection grounding electrode (not illustrated) detect strain in the detecting vibration arms 421 and 422 that is produced due to the vibration, and the angular velocity ω is obtained.

Package

The package 9 accommodates the gyro element 2. In addition to the gyro element 2, an IC chip or the like that drives the gyro element 2 may be accommodated in the package 9, like the electronic device that will be described later. Such a package 9 is substantially rectangular in a plan view (x-y plane view).

As illustrated in FIGS. 1 to 2B, the package 9 includes the base 91 that has a concave section that is opened to the top, and the lid 92 as the lid body that is joined to the base through the seam ring 93 as the joining material to close the opening of the concave section. In addition, the base 91 includes a plate-like bottom plate 911 and a frame-like side wall 912 that is provided on the top-surface circumferential edge of the bottom plate 911. The frame-like side wall 912 is provided circumferentially to form substantially a rectangular shape. In other words, the opening of the concave section that is opened to the top surface has substantially a rectangular shape. The concave section surrounded by the plate-like bottom plate 911, and the frame-like side wall 912 forms the inner space (accommodation space) 14 in which the gyro element 2 as the electronic component is accommodated. The seam ring 93 that is formed of an alloy, such as Kovar is provided on the top surface 912a of the frame-like side wall 912. The seam ring 93 functions as the joining material for the lid 92 and the side wall 912, and is provided along the top surface 912a of the side wall 912 in a frame shape (circumferential shape of a substantial rectangle).

The lid 92 has a substantially rectangular external appearance, and the bottomed groove 94 is provided on the rear surface 92b from the outer circumference toward the central portion (inner space 14 side). A configuration of the lid 92 will be described later in detail. When the lid 92 is mounted on the seam ring 93, the groove 94 is disposed so as to enter the inner space 14. In other words, the groove 94 is provided from an end of the lid 92 on the outer circumferential side to a position that overlaps the inner space 14 in a plan view.

Such a package 9 includes the inner space 14 inside, and the gyro element 2 is air-tightly accommodated and disposed in the inner space 14. After exhausting air (degassing) through the groove 94 from the inner space 14 in which the gyro element 2 is accommodated, the lid 92 that remains on the communicating portion where the groove 94 is formed is melted by an energy ray (for example, laser beam), and then sealed by the sealing portion 95 as a solidified melting portion, that is the sealing portion 95 by an energy ray welding. The end of the groove 94 on the outer side, that is, a portion that includes an outer circumferential surface 92c (see FIGS. 4A and 4B) of the lid 92 is melted and solidified such that the sealing portion 95 as the melting portion is formed.

A constituent material of the base 91 is not particularly limited, and various ceramics, such as aluminum oxide, can be used. In addition, a constituent material of the lid 92 is not particularly limited, and may be a member that has a linear expansion coefficient close to the constituent material of the base 91. For example, in a case where the constituent material of the base 91 is the ceramics described above, an alloy, such as Kovar, is preferable.

In the gyro element 2, the first and second supports 51 and 52 are fixed onto the top surface of the bottom plate 911 through a conductive fixing member 8, such as solder, or a conductive adhesive (adhesive in which a conductive filler, for example metal particles, such as silver, is dispersed in a resin material). Since the first and second supports 51 and 52 are positioned on the opposite ends of the gyro element 2 in the y axial direction, such portions are fixed on the bottom plate 911 such that the vibration body 4 of the gyro element 2 is supported on the opposite ends, and thus the gyro element 2 can be stably fixed onto the bottom plate 911. Therefore, unnecessary vibration (vibration other than detecting vibration) of the gyro element 2 is suppressed, and detection accuracy of the angular velocity ω by the gyro element 2 is improved.

In addition, six conductive fixing members 8 are provided separately from one another corresponding (contact) to two detection signal terminals 714, two detection grounding terminals 724, and the drive signal terminal 734 and the drive grounding terminal 744 that are provided on the first and second supports 51 and 52. In addition, six connection pads 10 corresponding to the two detection signal terminals 714, the two detection grounding terminals 724, the drive signal terminal 734, and the drive grounding terminal 744 are provided on the top surface of the bottom plate 911, and thus the connection pads 10 and any terminal corresponding to these connection pads are electrically connected through the conductive fixing member 8.

Lid as Lid Body

Figure 4A:
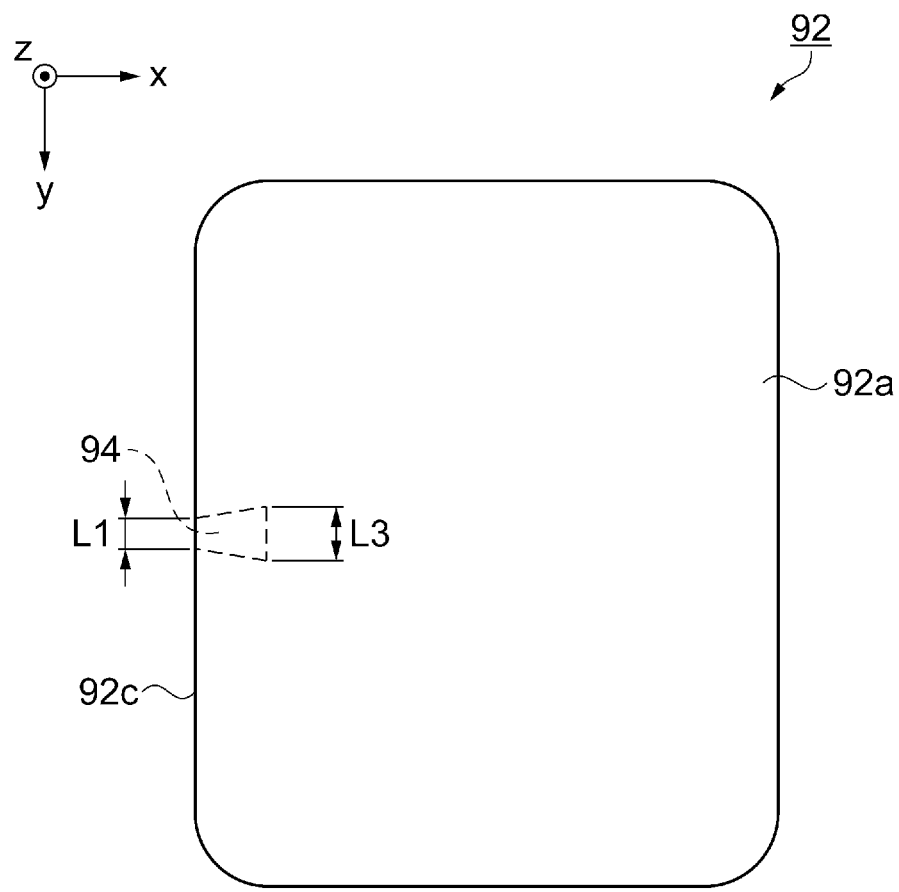
FIGS. 4A and 4B are views illustrating an example of a lid body (lid) that is used in the electronic device.
Figure 4B:
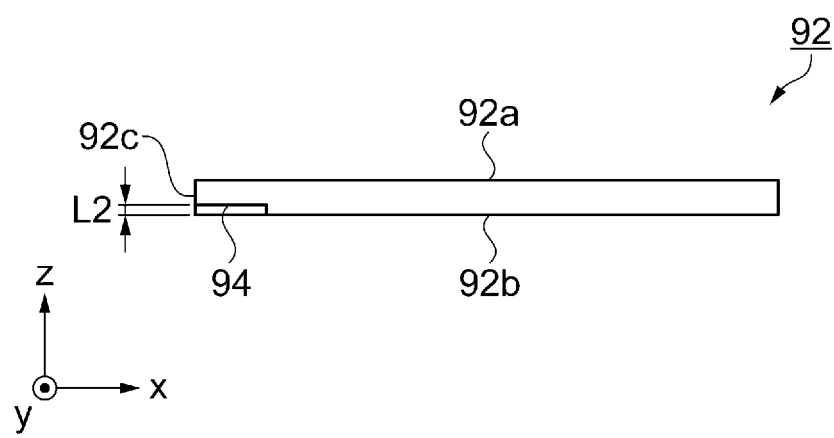

Here, the lid 92 as the lid body is described in detail with reference to FIGS. 4A and 4B. FIGS. 4A and 4B illustrate an example of the lid as the lid body according to the invention. FIG. 4A is a plan view, and FIG. 4B is a front cross-sectional view of a portion where the groove 94 is provided.

The lid 92 as the lid body closes the opening of the concave section that is opened to the top surface of the package 9, and is joined with the seam ring 93 around the opening of the concave section using, for example, a seam welding method. To be more exact, since the lid 92 is a plate-like member that has the front surface 92a and the rear surface 92b that are in a relation of front and rear, respectively, the outer circumferential surface 92c is connected with the front surface 92a and the rear surface 92b. Since the lid 92 according to the present example has a plate shape, it is easy to form the lid, and further it is good to stably form a shape. Particularly, the groove 94 to be described later is extremely small, but can be easily formed. In addition, a Kovar plate is used for the lid 92 according to the present example. When the Kovar plate is used for the lid 92 and sealing is performed, the seam ring 93 and the lid 92 that are formed of the Kovar are melted in the same molten state, and further it is possible to easily and accurately perform the sealing because the seam ring 93 and the lid 92 are likely to be alloyed. A plate of another material may be used for the lid 92 instead of the Kovar, and for example, a metal material, such as 42 alloy or stainless steel, which is the same material as that of the side wall 912 of the package 9, or the like can be used for the lid 92.

When the lid 92 is viewed from the front surface 92a, the bottomed groove 94 that extends from one side of the outer circumferential surface 92c toward the central portion of the lid 92 is provided on the rear surface 92b side. The groove 94 is provided to have substantially a rectangular shape in which an opening shape viewed from the outer circumferential surface 92c has a width L1 and a depth L2, and is positioned substantially at the center of one side in a plan view. When the lid 92 is mounted to close the opening of the concave section that is opened on the top surface of the package 9, the groove 94 is provided to extend from the outer circumferential surface 92c of the lid 92 toward the center such that a portion of the groove overlaps the opening. In other words, the groove 94 has one end 94a (see FIGS. 6A to 6D) that is opened on the outer circumferential surface 92c, and the other end 94b (see FIGS. 6A to 6D) on the central portion side. The other end 94b on the central portion side is provided to further reach the inner side (center side of the package in a plan view) from the inner wall of the frame-like side wall 912 that is provided on the top-surface circumferential edge of the bottom plate 911 that configures the base 91. Since the groove 94 is provided in this way, it is possible to expel gas from the inner space 14 of the package 9. In addition, since the other end 94b is provided in the groove 94 on the central portion side of the lid 92, it is possible to expel gas in one direction. That is, it is possible to be welded in one position (welding to close) in one groove and to achieve the sealing.

In addition, the groove 94 is formed such that the width L1 on the outer circumferential surface 92c side is less than the width L3 on the inner space 14 side. According to the present example, the groove is formed such that the width is gradually increased from the outer circumferential surface 92c side toward the central side. The depth L2 of the groove 94 is formed to have a substantially constant size. In this way, the groove 94 is provided such that the opening area (L3×L2) on the inner space 14 side (central side) is greater than the opening area (L1×L2) on the outer circumferential surface 92c side of the lid 92. In other words, the opening area on the outer circumferential surface 92c which is an irradiation position of the energy ray (for example, laser beam 98 (see FIGS. 6A to 6D)) is small. Accordingly, the sealing region (sealing portion 95 (see FIGS. 6A to 6D)) that is a melting portion formed during energy ray (for example, laser beam 98) welding can be decreased, and thus irradiation energy (melting energy) of the laser beam 98 can be decreased. In this way, the irradiation energy of the laser beam 98 is decreased, and thus it is possible to suppress damage to the side wall 912 of the base 91 that configures the package 9. Accordingly, it is possible to prevent a defect, such as a minute crack, from being produced on the side wall 912. In addition, since it is possible to decrease the irradiation energy of the laser beam 98, it is possible to suppress creation of a molten substance (also referred to as weld splash or dross) of the lid 92 that scatters when the lid 92 is welded, and it is possible to decrease the amount of the molten substance that enters the inner space 14. Accordingly, it is possible to prevent the characteristic degradation of the gyro element 2 due to the attachment of the scattered substance to the gyro element 2.

According to the present embodiment, an example is described, in which the groove 94 is positioned substantially at the center of one side that is a long side of the lid 92 in a plan view, but the configuration is not limited thereto. The groove 94 may be provided on at least one side of any of the sides of the lid 92. In addition, the groove 94 may be provided on one side that is a short side in a plan view. It is possible to obtain the following effect when the groove 94 is provided on the short side of the lid 92 in a plan view. The package 9 is likely to have a greater strain in the thickness direction (z axial direction) in the long-side direction than in the short-side direction. Therefore, a greater stress remains in the long-side direction than in the short-side direction in the lid 92 that is joined to the package 9. When the groove 94 is sealed (to be described later) while great stress remains, there is a concern that the remaining stress is applied to the sealing portion and the reliability of the seal is damaged. Therefore, the groove 94 is provided on the short side that has relatively low remaining stress, and thus it is possible to reduce influence of the remaining stress on the sealing portion.

In addition, the width L1 of the groove 94 on the outer circumferential side is not particularly limited, but is preferably from about 1 μm to 200 μm. It is particularly preferable that the width L1 be from 70 μm to 100 μm, because both gas exhausting properties and weldability are secured thereby. In addition, the depth L2 of the groove 94 is not particularly limited, but is preferably from about 5 μm to 30 μm. In addition, the width L3 of the groove 94 on the inner space 14 side is preferably 200 μm or less and greater than the width L1.

In addition, in some cases, seam welding is performed after a metal layer (not illustrated) that can be melted through the seam welding is formed on each of the lid 92 and base 91 of the connection portion between the base 91 and the lid 92. In this case, it is preferable that the depth of the groove 94 be greater than the sum of the thicknesses of the two metal layers (metal layer provided on the base 91 and metal layer provided on the lid 92). Accordingly, in a joining process to be described later, without closing the groove 94 formed on the joining surface between the lid 92 and the base 91, it is possible to firmly join the lid 92 and the base 91 through the seam welding.

After the air is expelled from the concave section (inner space 14) through a gap between the package 9 and the lid 92 which is formed by the groove 94, the lid 92 and/or the seam ring 93 at the communicating portion in which the groove 94 is provided is melted by the energy ray, such as the laser beam. In this way, the groove 94 is closed by the sealing portion 95 as the melting portion that is formed by the melted lid 92 and/or the melted seam ring 93 such that the inner space 14 is air-tightly sealed.

According to the present embodiment, an example is described, in which a single groove 94 is provided on the lid 92, but the number and disposition of the grooves are not limited. A plurality of grooves may be provided, and further the grooves may be provided on the front surface 92a and the rear surface 92b of the lid 92. In addition, according to the present embodiment, an example is described, in which the groove 94 is provided on the long side, but the groove may be provided on the short side. When the groove is provided on the short side, the side is short. Therefore it is appropriate in that the influence of the remaining stress of the melting of the lid 92 is unlikely to be applied during the second welding.

Manufacturing Method of Vibrator

Subsequently, the manufacturing method of the vibrator as the electronic device according to the invention is described with reference to FIGS. 5A to 6D. FIGS. 5A to 5D are front cross-sectional views illustrating an outline of the manufacturing process of the vibrator as the electronic device illustrated in FIGS. 1 to 2B described above. FIGS. 6A to 6D are views illustrating a sealing process. FIG. 6A is a plan view illustrating a correlation between a groove and an energy ray (laser beam), FIG. 6B is a front cross-sectional view of FIG. 6A, FIG. 6C is a plan view of the sealing portion, and FIG. 6D is a front cross-sectional view of FIG. 6C.

First, a process in which the gyro element 2 as the electronic component is accommodated in the inner space 14 of the base 91 is described. As illustrated in FIG. 5A, the base 91 is prepared. The base 91 has the plate-like bottom plate 911, and the frame-like side wall 912 that is provided on the top-surface circumferential edge of the bottom plate 911, and has a concave shaped space that is surrounded by the bottom plate 911 and the inner wall of the side wall 912 and is opened to the top surface. In the base 91, the seam ring 93 is formed on the top surface 912a of the frame-like side wall 912, and a connection pad 10 is formed on the top surface of the bottom plate 911. In addition, the gyro element 2 described above is prepared. The connection pad 10 and the gyro element 2 are electrically connected and fixed to each other. It is possible to use the conductive fixing member 8, such as a solder, or a conductive adhesive (adhesive in which a conductive filler, for example metal particles, such as silver, is dispersed in a resin material) in the connection. At this time, a gap is provided between the gyro element 2 and the top surface of the bottom plate 911 by the thickness of the conductive fixing member 8.

Subsequently, a process is described, in which the lid 92 as the lid body is mounted in the concave shaped space. As illustrated in FIG. 5B, in order to air-tightly maintain the gyro element 2 that is accommodated in the inner space 14, the lid 92 as the lid body described above is mounted on the seam ring 93. The groove 94 is provided on the rear surface 92b of the lid 92. As illustrated in FIGS. 6A to 6D, the lid 92 is provided such that the one end 94a of the groove 94 on the outer circumferential side is positioned on the seam ring 93, and the other end 94b of the groove 94 on the inner space 14 side is positioned to overlap the inner space 14, in a plan view (in a case when viewed from the lid 92 side). In other words, the lid 92 is provided such that at least a part of the groove 94 of the lid 92 enters the inner space 14 in a plan view. That is, a regional gap as the communicating portion is formed between the lid 92 and the seam ring 93 after the process in which the lid 92 is mounted. The inner space 14 and the outside of the base 91 communicate with each other in the regional gap through the groove 94 from the one end 94a as the opening on the outer circumferential side to the inner opening 94c at a position where the groove 94 overlaps the inner circumferential surface 93a of the seam ring 93.

Subsequently, a joining process (first welding process) in which the lid 92 is joined to the base 91 using the seam ring 93 is described. As illustrated in FIG. 5C, the lid 92 and the seam ring 93 are joined by performing the seam welding of a portion where the lid 92 and the seam ring 93 face each other on the frame-like side wall 912 having a circumferential shape of a rectangle using roller electrodes 97 of a seam welder. That is, the lid 92 is joined to the base 91. The roller electrode 97 comes into pressure contact with the lid 92 from an opposite side of the base 91 using a pressure mechanism not illustrated. The roller electrode 97 rotates about an axial line, and travels along the outer circumferential side of the lid 92 in a plan view at a predetermined speed. At this time, a current flows between the roller electrodes 97 through the lid 92 and the seam ring 93, and thus the seam ring 93 or the a joining metal is melted by Joule heat, and the lid 92 and the seam ring 93 are joined. In this way, the lid 92 is welded (joined) to the base 91 through the seam ring 93 provided on the top surface of the frame-like side wall 912 that configures the base 91. It is possible to employ a configuration in which the lid 92 is directly welded (joined) to the base 91.

At this time, since the lid 92 at the portion where the groove 94 is provided does not come into contact with the seam ring 93 due to the groove 94, the seam welding is not performed at the portion and the lid remains in an unwelded state. In other words, since the inner surface of the groove 94 does not come into contact with the seam ring 93, the seam welding is not performed. That is, a portion excluding the portion corresponding to the groove 94, of a scheduled joining portion between the base 91 and the lid 92 is joined using the seam welding in the joining process. Since the groove 94 enables the inner space 14 and the outside of the base 91 to communicate with each other, the unwelded space functions as an exhausting hole in the subsequent sealing process.

Subsequently, a process in which the air is expelled from the inner space 14 using the groove 94 (exhausting hole) will be described. According to the present embodiment, as illustrated in FIG. 5D, the groove 94 that is not welded during the above seam welding extends as the communicating portion that reaches the inner space 14. Thus, the groove 94 is used as the exhausting hole, and it is possible to expel gas from the inner space 14 in the arrow direction as illustrated in FIG. 5D. According to the present embodiment, an example is described, in which the inner space 14 is sealed under a so-called pressure reduction, in a state in which the gas is expelled from the inner space 14, but the condition is not limited to being done under the pressure reduction, and it is possible to perform sealing under an inert gas atmosphere in which an inert gas or the like is introduced after the air is expelled.

Subsequently, a sealing process (second welding process) in which the air-expelled inner space 14 is air-tightly sealed is described with reference to FIGS. 6A to 6D. As illustrated in FIGS. 6A and 6B, the lid 92 at the portion (communicating portion) that corresponds to the groove 94 used as the exhausting hole is irradiated with the energy ray (for example, laser beam or electron beam) in a state in which the air is completely expelled from the inner space 14. According to the present embodiment, the lid 92 is irradiated with the laser beam 98 as the energy ray, and the metal (Kovar) in the remaining portion is melted. At this time, the end of the groove 94 on the outer side, that is, the one end 94a of the groove 94 that includes the outer circumferential surface 92c of the lid 92 is disposed to be included within a spot reached by the laser beam 98, and is irradiated with the laser beam 98. As illustrated in FIGS. 6C and 6D, an above-groove portion 92d on the front surface 92a side of the lid 92 at the portion where the groove 94 is provided is melted using the heat energy from the irradiation of the laser beam 98, and the molten metal fills the groove 94 and flows onto the seam ring 93. When the molten metal sufficiently flows, and the irradiation of the laser beam 98 is stopped, the molten metal is solidified, the solidified metal forms the sealing portion (melting portion) 95, and the groove 94 is closed. Accordingly the inner space 14 is air-tightly sealed.

As described above, the irradiation with the laser beam 98 is performed such that end of the groove 94 on the outer side within the spot reached by the laser beam 98, that is, an end portion of the groove 94 that includes the outer circumferential surface 92c of the lid 92 is included, the above-groove portion 92d of the lid including the end of the groove 94 is melted, and thus good flowability of the molten metal is achieved. Such improved flowability of the molten metal makes it possible to reliably perform the sealing of the groove 94. In addition, the groove 94 is formed to be gradually increased in width from the outer circumferential surface 92c toward the central side (inner space 14 side). The opening area of the groove 94 at the portion that is sealed by the sealing portion 95 that is the melting portion is not great, and thus it is possible to decrease the irradiation energy of the laser beam 98 when the welding is performed to close the groove 94, and it is possible to suppress damage to the side wall 912. That is, the heat energy produced in the lid 92 due to the irradiation of the laser beam 98 is diffused around a irradiation region, but the heat energy is likely to stay on the outer circumferential surface 92c side because the diffusion region is further limited on the outer circumferential surface 92c side than on the center side. Therefore, the lid 92 is likely to be melted from the outer circumferential surface 92c side. Therefore, the opening area of the groove 94 that is likely to start melting is decreased, and thus it is possible to seal the groove by performing a small amount of melting for a short time. In addition, since the opening area of the groove on the inner space 14 side is greater than on the outer circumferential surface 92c side, the molten substance is likely to remain on the outer circumferential surface 92c side due to capillarity, and thus it is possible to form an effective seal with a small amount of the molten substance. In addition, since the small amount of irradiation energy is sufficient, it is possible to reduce the amount of the molten substance of the lid body (also referred to as weld splash or dross) that scatters when the welding is performed, and thus it is possible to decrease the amount of the molten substance that enters the inner space. Accordingly, it is possible to suppress the characteristic degradation of the electronic components due to the attachment of the scattered substance to the electronic components.

When the manufacturing method of the vibrator 1 as the electronic device which includes such processes is used, it is possible to easily perform the pressure reduction or to easily make the inner space 14 an inert gas atmosphere with the groove 94 through which the inner space 14 and the outside communicate with each other. The lid 92 at the communicating portion is irradiated with the laser beam 98 to close the groove 94, and thus it is possible to easily seal the inner space 14 in which the pressure reduction is performed or which has an inert gas atmosphere. In addition, while the characteristic degradation of the gyro element due to the attachment of the scattered substance is suppressed, it is possible to provide the vibrator 1 in which the reliability of the air-tight sealing is improved.

In the above description, an example is described, in which one exhausting hole (groove 94) is used, but a plurality of exhausting holes may be used. In this way, in a case where the plurality of exhausting holes is used, the exhausting rate is high, but a plurality of portions need to be sealed.

Modification Example of Joining Process and Joining Structure

According to the first embodiment described above, the joining method is described, in which the seam ring 93 that is a ring-like metal frame body as the joining material and that causes the base 91 and the lid 92 to be joined to each other is used, and the seam welding is performed by the roller electrode 97 of the seam welder, but other joining methods can be applied. As the other joining methods, a joining method (so-called direct seam method) can be applied, in which a brazing material, such as a silver brazing material, is disposed as a joining material on the top surface of the frame-like side wall 912 of the base 91 or on the front surface of the lid 92, the brazing material is melted using the roller electrode 97 of the seam welder, and the lid 92 and the base 91 are joined by the melted metal brazing material. In this case, the metal brazing material may be melted using the energy ray, such as the laser beam or the electron beam. Further, a joining method, in which a part of the lid is melted, and the lid 92 and the base 91 are directly joined using the melted lid portion, without joining the lid 92 and the base 91 through the joining material, can be applied as another joining method. According to those joining methods, since the seam ring 93 is not necessary, it is possible to realize a reduction in size and cost of the electronic device.

Modification Example 1 of Groove in Joining Process

According to the first embodiment described above, as illustrated in FIG. 6A, when the lid 92 is mounted on the seam ring 93 and joined to the base 91, the groove 94 extends so as to enter the inner space 14 from the outer circumferential surface 92c of the lid 92, and thus the communicating portion in which the inner space 14 and the outside of the base 91 communicate with each other through the groove 94 is formed. However, the groove 94 may not extend to the inner space 14. That is, the groove 94 may be present in a region between the inner circumferential surface 93a of the seam ring 93 and the outer circumferential surface 92c of the lid 92 without overlapping the inner space 14 in a plan view. In this case, the groove 94 does not communicate with the inner space 14. However, on a surface (rear surface 92b) of the lid 92 on a side where the groove 94 is provided, a region adjacent to the groove 94, that is, a region adjacent to the inner space 14 in a plan view, is appointed as an unwelded region that is not welded to the seam ring 93, a region that overlaps the seam ring except in the unwelded region is welded using the seam welder, and thus it is possible to perform the degassing described above through a narrow gap between the unwelded region of the lid 92 and the seam ring 93. In this case, the narrow gap between the unwelded region of the lid 92 and the seam ring 93 is used as an opening on the inner space 14 side (central side). However, since the opening portion of the end of the groove 94 on the outer side, that is, the one end 94a of the groove 94 including the outer circumferential surface 92c of the lid 92 is disposed to be included within the spot of the laser beam 98 as illustrated in FIG. 6A, it is possible to decrease the irradiation energy of the laser beam 98. As a result, the same effect as in the first embodiment described above is achieved.

Modification Example 2 of Groove in Joining Process

Figure 7:
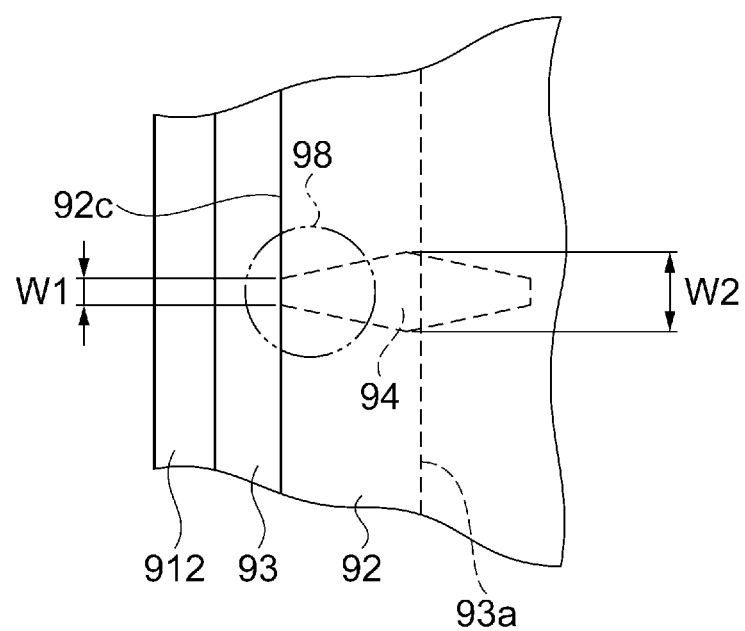
FIG. 7 is a plan view illustrating Modification Example 2 of the groove.

In addition, the groove 94 may have a shape as illustrated in FIG. 7. FIG. 7 is a plan view illustrating Modification Example 2 of the groove. As illustrated in FIG. 7, the groove 94 of Modification Example 2 has a width that is continuously increased from the outer circumferential surface 92c of the lid 92 toward the inner space 14, in a plan view, has an inflection point in the vicinity of a portion where the inner circumferential surface 93a of the seam ring 93 overlaps the groove, and further has a width that is continuously decreased toward the inner space 14, in a plan view. At this time a width W1 of an opening of the lid 92 on the outer circumferential surface 92c side is less than a width W3 of an opening on the inner space 14 side. The change of width size may not be continuous, but a configuration in which the width is changed in a stepwise manner may be employed. Even the groove 94 having such a configuration has the same effect as in the first embodiment described above.

Modification Example 3 of Groove in Joining Process

Figure 8A:
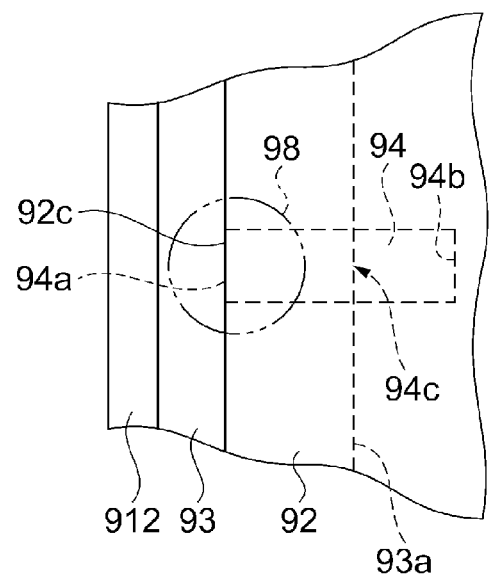
FIGS. 8A to 8C are views illustrating Modification Example 3 of the groove.
Figure 8B:
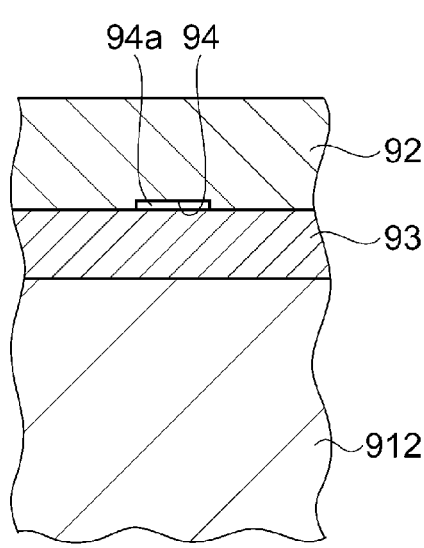
Figure 8C:
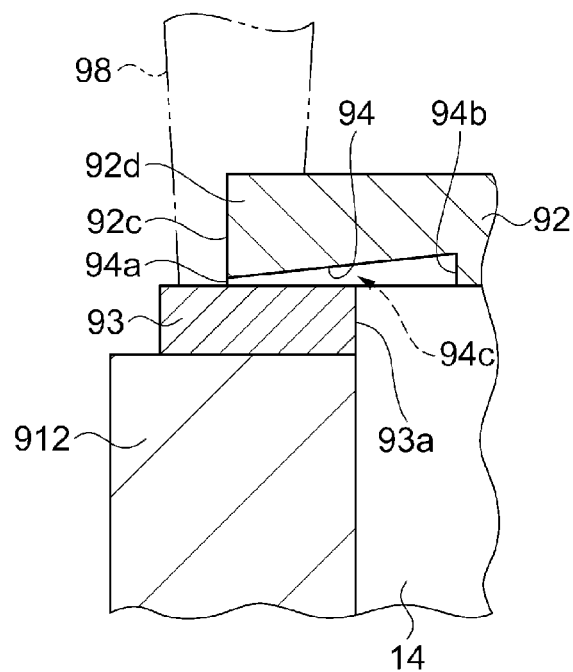

In addition, the groove 94 may have a shape as illustrated in FIGS. 8A to 8C. FIGS. 8A to 8C are views illustrating Modification Example 3 of the groove. FIG. 8A is a plan view, FIG. 8B is a side view illustrating an opening of the groove on the outer circumferential side, and FIG. 8C is a front cross-sectional view of FIG. 8A. As illustrated in FIGS. 8A to 8C, the groove 94 of Modification Example 3 is formed to be gradually deeper from the one end 94a of the groove 94 that is opened on the outer circumferential surface 92c of the lid 92 toward the other end 94b on the inner space 14 side. That is, the inner opening 94c on the inner space 14 side that is present at a position where the inner circumferential surface 93a of the seam ring 93 and the groove 94 are overlapped with each other in a plan view has a greater opening area than that of the one end 94a of the groove 94 that is opened on the outer circumferential surface 92c side of the lid 92. Accordingly, the groove 94 is formed to have a smaller opening area on the outer circumferential surface 92c than on the inner space 14 side, and thus it is possible to decrease the melting volume of the lid 92 during welding by the laser beam 98, and to decrease the energy of the laser beam 98. Accordingly, it is possible to decrease the irradiation energy of the laser beam 98 in the sealing process by which the groove 94 is closed. As a result, the same effect as in the first embodiment described above is achieved.

According to Modification Example 3 described above, an example is described, in which the depth of the groove 94 is continuously changed, but a configuration may be employed, in which the depth of the groove 94 is increased from the outer circumferential surface 92c side of the lid 92 toward the inner space 14 in a stepwise manner.

According to the manufacturing method of the vibrator 1 of the first embodiment described above, the lid 92 and the base 91 are joined such that the inner space 14 and the outside communicate with each other through the groove 94 provided on the lid 92. It is possible to easily perform pressure reduction of the inner space 14 or to easily cause the inner space 14 to be an inert gas atmosphere using the groove 94 through which the inner space 14 communicates with the outside. The lid 92 at the communicating portion is irradiated with the laser beam 98 to melt the lid 92 such that the communicating portion is closed, and thus it is possible to easily seal the inner space 14 in which the pressure reduction is performed or which has an inert gas atmosphere. Accordingly, it is possible to perform sealing after the gas produced during joining of the lid 92 is removed from the package 9, and to provide the vibrator 1 in which the air-tight sealing with high quality is realized.

In addition, the groove 94 is provided on the lid 92 such that the opening area on the outer circumferential surface 92c side of the lid 92 is less than the opening area on the inner space 14 side (central side). The groove 94 at a portion that is sealed by the sealing portion 95 that is the melting portion has a smaller opening area, and thus it is possible to decrease the irradiation energy of the laser beam 98 generated when the welding to close the groove 94 is performed. Therefore, it is possible to suppress the damage to the side wall 912. Accordingly, it is possible to suppress a defect, such as a minute crack from being produced on the side wall 912. In addition, since the irradiation energy does not need to be high, it is possible to decrease the amount of the molten substance of the lid 92 or the like, that scatters when the welding is performed. Therefore, it is possible to reduce the amount of the molten substance that enters the inner space 14. Accordingly, it is possible to suppress the characteristic degradation of the gyro element 2 due to the attachment of the scattered substance to the gyro element 2 as the electronic component.

Second Embodiment of Electronic Device

Figure 9:
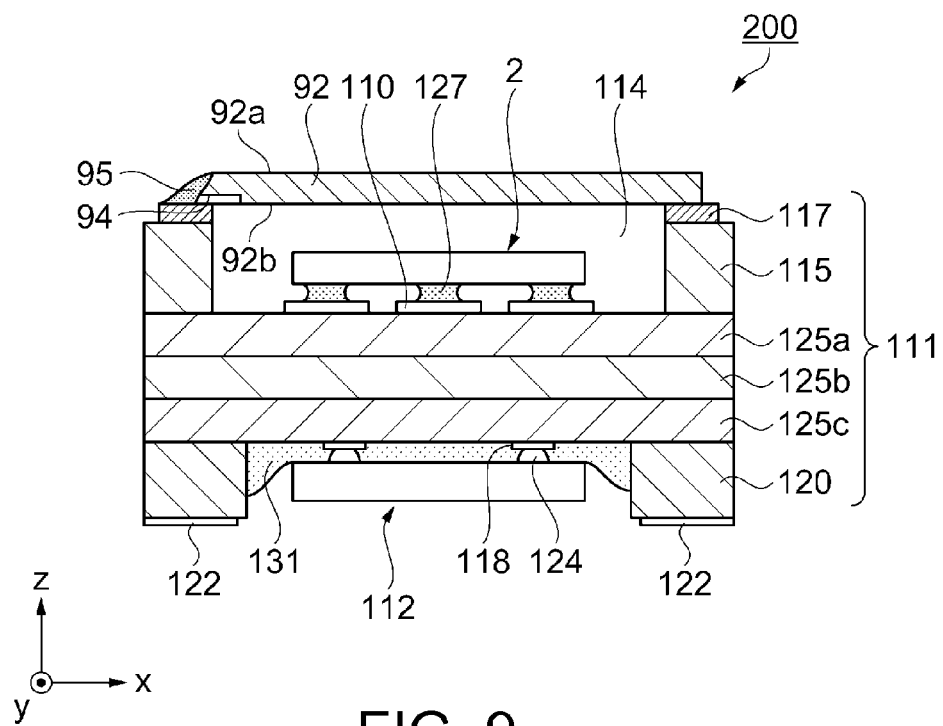
FIG. 9 is a front cross-sectional view schematically illustrating a gyro sensor as a second embodiment of the electronic device.

Subsequently, an embodiment of the gyro sensor as a second embodiment of the electronic device will be described with reference to FIG. 9. FIG. 9 is a front cross-sectional view schematically illustrating the gyro sensor. According to the present embodiment, the same configuration as that in the first embodiment described above has the same reference signs, and the description thereof is not repeated.

A gyro sensor 200 includes the gyro element 2 as the electronic component, an IC 112 as the circuit element, a package (base) 111 as an accommodation unit, and the lid 92 as the lid body. The package 111 formed of ceramics or the like, includes a third substrate 125c, a second substrate 125b, and a first substrate 125a which are stacked, a frame-like side wall 115 that is provided on the front-surface circumferential edge of the first substrate 125a, and a frame-like side wall 120 that is provided on the front-surface circumferential edge of the third substrate 125c.

A seam ring 117 as the joining material formed of an alloy, such as Kovar, is formed on the top surface of the frame-like side wall 115. The seam ring 117 functions as the joining material for the lid 92, and is provided along the top surface of the side wall 115 in a frame shape (circumferentially). In the lid 92, the groove 94 is provided on the end of the rear surface 92b that is a surface facing the seam ring 117. The configuration of the lid 92 is the same as in the first embodiment described above. When the lid 92 is mounted on the seam ring 117, the groove 94 is formed so as to enter the inner space 114. Here, a space surrounded by the front surface (upper surface in FIG. 9) of the first substrate 125a and the inner wall of the frame-like side wall 115 forms the inner space 114 that accommodates the gyro element 2, and a space surrounded by the third substrate 125c and the inner wall of the frame-like side wall 120 forms an accommodation section of the IC 112. After the air is expelled (degassing) from the inner space 114 through the groove 94, the inner space 114 where the gyro element 2 is accommodated is sealed by the sealing portion 95 that is solidified after the lid 92 at a remaining portion where the groove 94 is formed is melted. In addition, a plurality of external terminals 122 is provided on the front surface (lower surface in FIG. 9) of the frame-like side wall 120.

A plurality of connection pads 110 are formed on the front surface of the first substrate 125a that is positioned in the inner space 114 in which the gyro element 2 is accommodated, and the gyro element 2 is fixed to the connection pad 110 by an electrical connection. In the connection, a conductive fixing member 127, such as solder, or a conductive adhesive (adhesive in which a conductive filler, for example metal particles, such as silver, is dispersed in a resin material) can be used. At this time, a gap is provided between the gyro element 2 and the front surface (top surface in FIG. 9) of the first substrate 125a by the thickness of the conductive fixing member 127.

The opening of the inner space 114, where the gyro element 2 is accommodated, is closed by the lid 92 as the lid body, and the inner space 114 is air-tightly sealed. Since the lid 92 has the same configuration as the lid 92 described in the first embodiment described above, the detailed description thereof is not repeated, but the outline will be described. The lid 92 closes the opening of the inner space 114 that is opened to the top surface of the package 111, and the periphery of the opening is joined to the lid 92 using the seam welding method. The lid 92 is formed of a plate material of Kovar, and has the front surface 92a and the rear surface 92b that are in a relation of front and rear, respectively. Similar to the first embodiment described above, the bottomed groove 94 that is provided from the outer circumferential surface of the lid 92 on the rear surface 92b side toward the inner space 114 (center portion) is provided on the lid 92. After the remaining air is expelled from the inner space 114 through the groove 94 that is a gap between the seam ring 117 and the lid 92, a portion that includes an end of the groove 94 is melted using a laser beam or the like, and then the resultant is solidified, and thus the air-tight sealing of the inner space 114 is performed.

Meanwhile, a connection electrode 118 is formed on the front surface of the third substrate 125c positioned in the accommodation section of the IC 112, and the connection electrode 118 and the IC 112 are fixed in an electrical connection with gold (Au) bumps 124. A gap between the IC 112 and the front surface of the third substrate 125c is buried using an underfill 131, such as a resin. The resin may be provided to cover the IC 112. The connection pad 110, the connection electrode 118, the external terminal 122, and the like are each connected using internal wiring, or the like, but the description and drawing of the internal wiring are not provided in the present embodiment.

Manufacturing Method of Gyro Sensor

Subsequently, a manufacturing method of the gyro sensor 200 is described, and the description of the same process as the process described in the manufacturing method of the vibrator 1 described above is not repeated. The processes not to be described are the process in which the gyro element 2 is accommodated in the inner space 114 of the package 111 as the base, the process in which the lid 92 is mounted on the inner space 114, the joining process in which the lid 92 is joined to the package 111, and the sealing process in which the inner space 114 from which the remaining air is completely expelled is air-tightly sealed.

In addition to the processes described above, the IC 112 is accommodated in the accommodated portion of the IC 112 surrounded by the frame-like side wall 120 provided on the front-surface circumferential edge of the third substrate 125c in the manufacturing of the gyro sensor 200. The IC 112 is fixed to the connection electrode 118 provided on the front surface of the third substrate 125c using the gold (Au) bumps 124 in an electrical connection. The gap between the IC 112 and the front surface of the third substrate 125c is filled with the underfill 131, such as a resin, and the gap is filled. The gyro sensor 200 is completed through the above processes.

According to the second embodiment described above, similar to the first embodiment described above, it is possible to melt the lid 92 with the laser beam using a small amount of irradiation energy, and it is possible to reliably form the sealing portion 95 in which damage to the package (base) 111 is suppressed. Thus, it is possible to perform the reliable sealing of the groove 94, and to manufacture the gyro sensor 200 as the electronic device in which the reliability of the air-tight sealing is improved. In addition, since the groove 94 becomes the exhausting hole as is, it is not necessary to control the size of an unjoined portion (exhausting hole) that is used for exhausting the remaining air unlike in the related art. Thus, the remaining air is stably expelled and the joining (sealing) is stably performed. Therefore, even in a case where the gyro sensor 200 is heated to a high temperature after the joining (sealing), it is possible to suppress the creation of gas. In addition, it is possible to prevent characteristic degradation in the gyro element 2 as the electronic component accommodated in the package 111 due to the influence of the remaining gas, the scattered molten substance, or the like, by the stable exhausting of gas and joining (sealing), and thus it is possible to provide the gyro sensor 200 with stable characteristics as the electronic device.

Third Embodiment of Electronic Device

Figure 10:
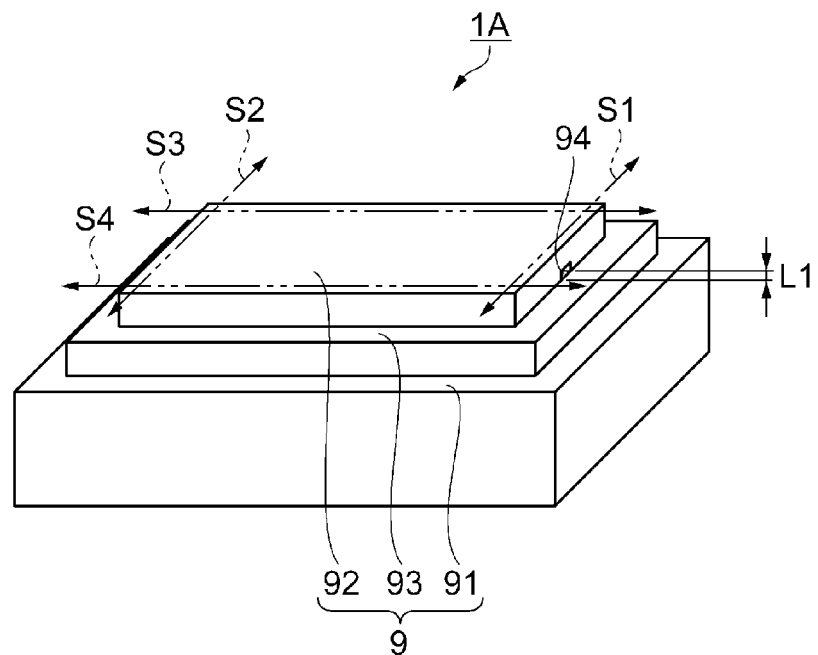
FIG. 10 is a perspective view schematically illustrating a vibrator as a third embodiment of the electronic device.

Subsequently, an embodiment of a vibrator as a third embodiment of the electronic device according to the invention will be described with reference to FIG. 10. FIG. 10 is a perspective view schematically illustrating the vibrator as the third embodiment of the electronic device according to the invention. According to the present embodiment, the same configuration as that in the first embodiment described above has the same reference signs, and the description thereof is not repeated.

Similar to the first embodiment described above, a vibrator 1A as an example of the electronic device illustrated in FIG. 10 includes a gyro element (not illustrated) as the electronic component and a package 9 that accommodates the gyro element in an inner space. The gyro element (not illustrated) and the package 9 have the same configuration as in the first embodiment, and thus the description thereof is not repeated. The package 9 illustrated in FIG. 10 includes the base 91, the seam ring 93 as the joining material, and the lid 92 as the lid body. In FIG. 10, the groove 94 provided on the lid 92 is illustrated, which illustrates a state in which sealing (sealing process) to be described later is not performed. The groove 94 according to the present embodiment is provided on a short side of the base 91 and the lid 92 which configure the package 9. In addition, a groove width L1 of the groove 94 is formed by seam welding in a second welding process to be described later so as to have a sealable width size. The groove width L1 is determined to have an appropriate value under a welding condition of the seam welding in the second welding process, and is preferably from about 1 μm to 70 μm.

First, the gyro element as the electronic component is accommodated in the inner space of the package 9. This process is similar to the first embodiment described above, and thus the description thereof is not repeated.

Subsequently, a process in which the lid 92 as the lid body is mounted in the inner space is described. In order to air-tightly hold the gyro element that is accommodated in the inner space, the lid 92 is mounted on the seam ring 93. The groove 94 is provided on the rear surface (surface on the seam ring 93 side) of the lid 92. The groove 94 is provided on the short side of the lid 92. Since the lid 92 is mounted at the same position as in the first embodiment, the description thereof is not repeated.

Subsequently, a joining process (first welding process) in which the lid 92 is joined to the base 91 by the seam ring 93 will be described. First, the lid 92 and the seam ring 93 are joined to each other in such a manner that the seam welding is performed using the roller electrode (see FIG. 5C) of the seam welder at portions of the traces S2, S3, and S4 along three sides of the lid 92 but not in a trace 51 illustrated in FIG. 10. That is, the lid 92 is joined to the base 91 on three sides, excluding the other one side on which the groove 94 is provided. Accordingly, a regional gap in which the opening on the outer circumferential side and the inner space communicate with each other through the groove 94, and a narrow gap (unwelded portion) between the lid 92 and the seam ring 93 are formed between the lid 92 and the seam ring 93 on one side where the groove 94 is provided, and the gap functions as an exhausting hole in the subsequent sealing process. Since the seam welding is similar to that in the first embodiment, the description thereof is not repeated.

Subsequently, the remaining air is expelled from the inner space through the one side that includes the groove 94 (exhausting hole). According to the present embodiment, the sealing is performed under the pressure reduction state (so-called a vacuum state) in which the remaining gas in the inner space is expelled. However, the condition is not limited to the pressure reduction state, and it is possible to perform the sealing under an inert gas atmosphere in which the inert gas is introduced after the air is expelled.

Subsequently, the sealing process (second welding process) is described, in which the inner space from which the remaining air is completely expelled is air-tightly sealed. In a state in which the remaining air is completely expelled from the inner space, the seam welding of the unwelded portion of one side of the lid 92, where the groove 94 used as the exhausting hole is provided is performed, along the trace S1 using the roller electrode of the seam welder, similarly to the first welding process described above. The lid 92 on the one side where the groove 94 is provided is joined to the base 91 (seam ring 93) by the seam welding in the second welding process, and the inner space is air-tightly sealed.

According to the present embodiment, in addition to the narrow gap (unwelded portion) between the lid 92 and the seam ring 93 along one side that is the portion that is welded by the trace S1, the regional gap, in which the opening on the outer circumferential side communicates with the inner space through the groove 94, is provided. Therefore, it is possible to easily expel the air from the inner space. In addition, it is possible to easily seal the inner space in which the pressure reduction is performed or which has an inert gas atmosphere by the seam welding of the trace S1 in the second welding process. Accordingly, it is possible to perform sealing after the gas created during the joining of the lid 92 is removed from the package 9, and thus it is possible to provide the vibrator 1A in which the high quality air-tight sealing is realized. In addition, since the joining is performed on the one side of the short side in the second welding process after the remaining air is expelled, it is possible to decrease the amount of the gas (the remaining gas in the inner space) during the joining in the second welding process. In addition, since the laser beam is not used in the sealing process, it is possible to prevent damage to the base 91 by the irradiation of the laser beam, it is possible to suppress the scattering of the molten substance, and also it is possible to obtain the vibrator having stable characteristics.

According to the third embodiment, a method is described, in which welding is performed along three sides where the groove 94 is not formed in the first welding process, and the remaining one side is welded in the second welding process after exhausting process, but the method is not limited thereto. For example, first, in the first welding process, the portions of the trace S3 and the trace S4 along the two sides on the long sides may be seam-welded, and the remaining traces S1 and S2 along the two short sides may be seam-welded in the second welding process after the following exhausting process. Such welding also has the same effect as the third embodiment.

Opening Shape of the Groove

Here, the opening shape of the groove 94 that is formed on the lid 92, which is used in the first embodiment, the second embodiment, and the third embodiment is described with reference to FIGS. 11A to 11E. FIGS. 11A to 11E are front views illustrating examples of the opening shape of the groove when the groove is viewed from the front. According to the embodiments described above, the opening shape of the groove 94 that is provided on the lid 92 is described with the rectangular groove 94 as an example as illustrated in FIG. 11E, but the shape is not limited thereto. Other shapes may be employed as follows.

Figure 11A:
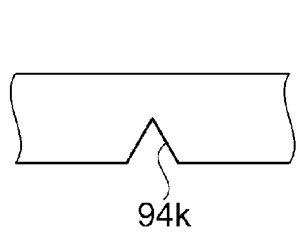
FIGS. 11A to 11E are front views illustrating examples of opening shapes of the groove.

A groove 94k illustrated in FIG. 11A has a wedge shape (a triangle that has two vertexes on the rear surface 92b side). The wedge-shaped groove 94k makes it possible to have good moldability when using a molding tool (for example, molding die) to mold the groove 94k. That is, a tip of the molding tool has a tapered shape, and thus it is possible to easily press the molding tool.

Figure 11B:
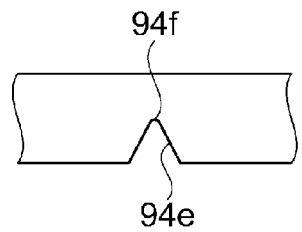

In a groove 94e illustrated in FIG. 11B, a wedge-shaped tip portion 94f has a curved R shape (R shape is formed). The tip portion 94f has an R shape, and thus, in addition to the good moldability described above, it is possible to increase the strength of the tip of the molding tool. Therefore it is possible to achieve service-lifetime improvement in the molding tool, and to maintain stable moldability.

Figure 11C:
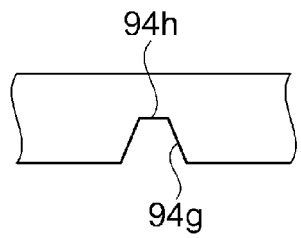

In addition, in a groove 94g illustrated in FIG. 11C, a wedge-shaped tip portion 94h that is formed of a narrow straight-line portion is formed such that the shape of groove 94g is a so-called trapezoid. When the groove 94g has the tip portion 94h formed of a narrow straight portion, it is possible to increase the strength of the tip of the molding tool in addition to maintaining the same good moldability as in the groove 94e described above, and to achieve service-lifetime improvement in the molding tool, and to maintain stable moldability.

Figure 11D:
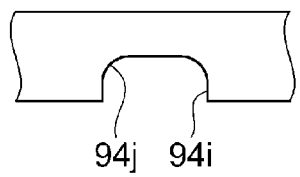
Figure 11E:
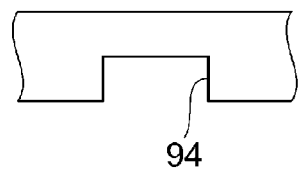

In addition, in a groove 94i illustrated in FIG. 11D, a portion in which the rectangular bottom surface and the side surface intersect each other is a curved R shaped portion 94j. According to the groove 94i, it is possible to achieve the service-lifetime improvement in the molding tool and also to improve moldability, compared to the groove 94 illustrated in FIG. 11E.

In the description of the electronic device described above, the vibrator 1 using the so-called double T type gyro element 2 as the electronic component and the gyro sensor 200 are described as examples, but the electronic device is not limited thereto. The invention can be applied to an electronic device that air-tightly accommodates an element in a package. Other electronic devices may include a gyro sensor using H-shaped or tuning fork type gyro element as an electronic component, a timing device (vibrator, oscillator, or the like) using a vibration element, a pressure sensor using a pressure-sensitive element, a semiconductor device using a semiconductor element, or the like.

In addition, as the vibration element, a piezoelectric vibration element, such as an MEMS element using a piezoelectric body, a quartz crystal vibration piece that performs bending vibration, such as a tuning fork type quartz crystal vibrator piece using a quartz crystal as a material, a longitudinal vibration type quartz crystal vibrator piece, a thickness-shear quartz crystal vibrator piece, or the like can be appropriately used.

Electronic Apparatus

Figure 12:
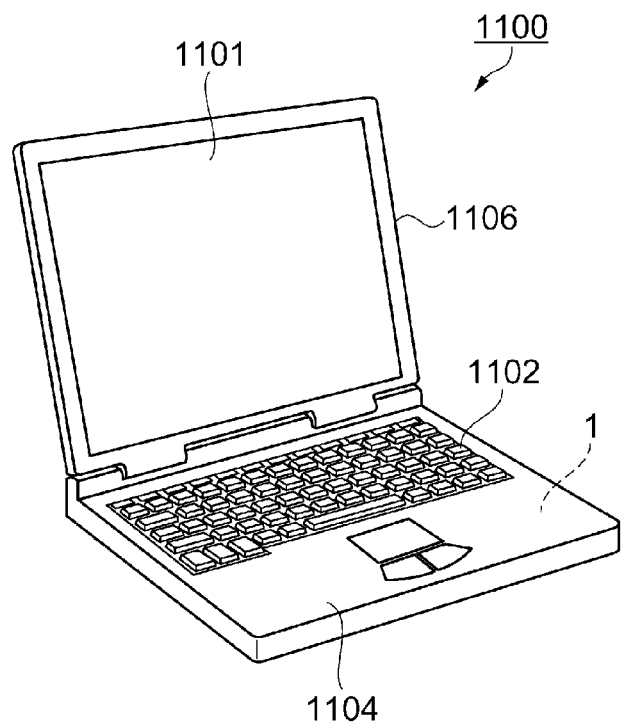
FIG. 12 is a perspective view illustrating a configuration of a mobile-type personal computer as an example of an electronic apparatus.
Figure 13:
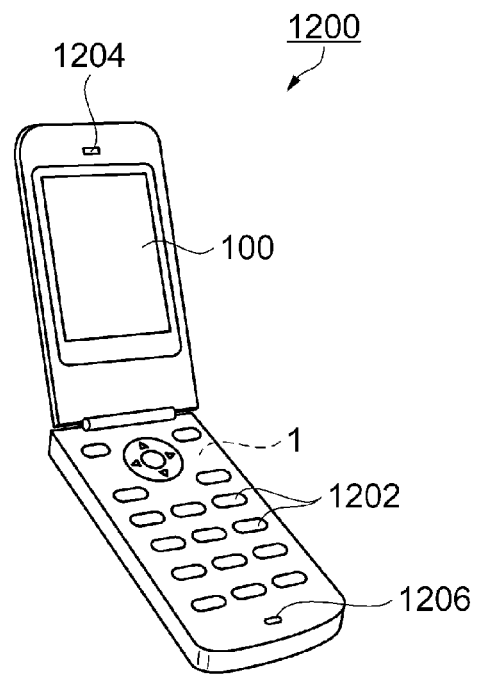
FIG. 13 is a perspective view illustrating a configuration of a mobile phone as an example of the electronic apparatus.
Figure 14:
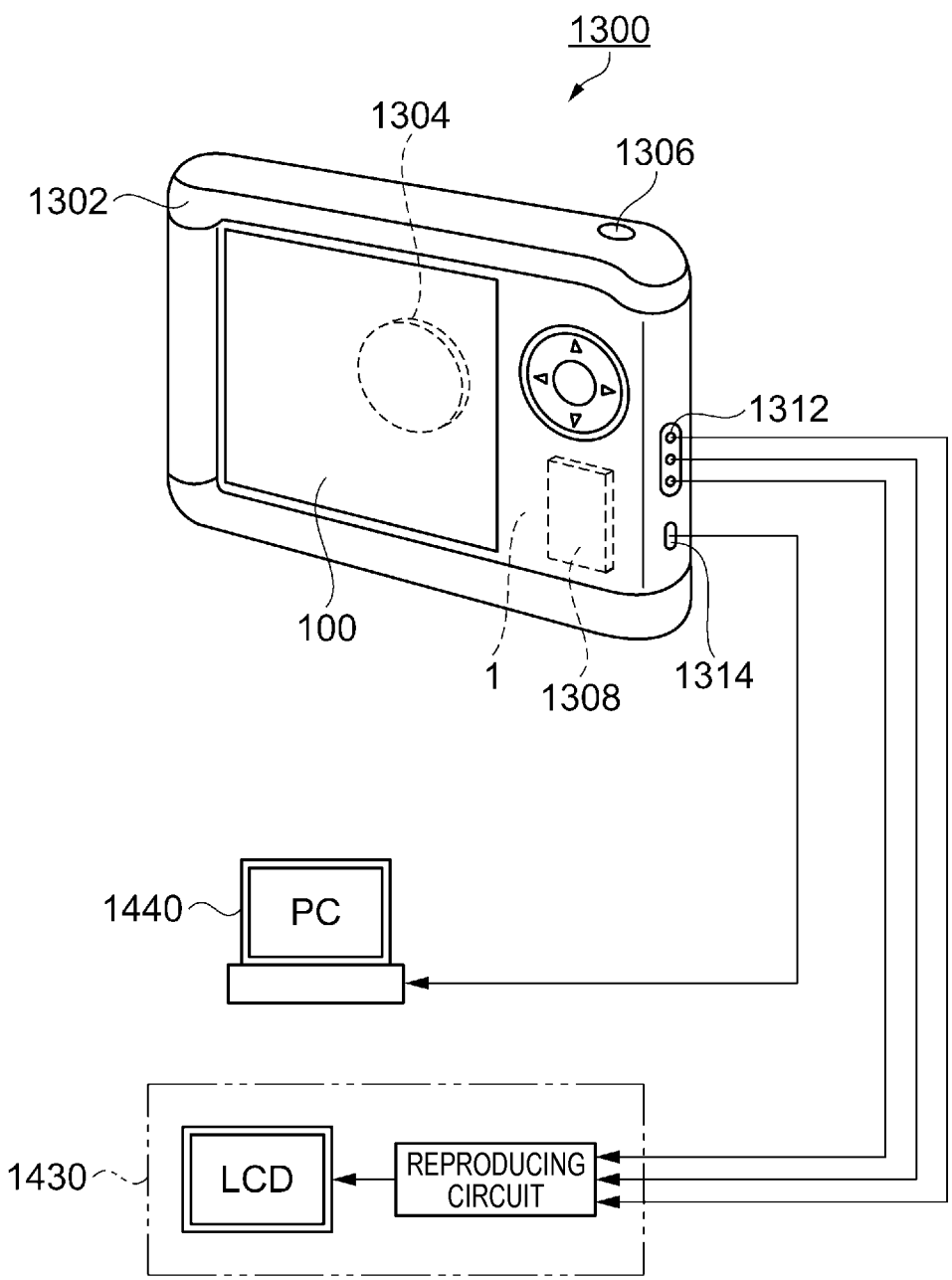
FIG. 14 is a perspective view illustrating a configuration of a digital still camera as an example of the electronic apparatus.

An electronic apparatus is described in detail, to which the vibrators 1 or 1A as the electronic device according to an embodiment of the invention, or the gyro sensor 200 as the electronic device is applied, with reference to FIGS. 12 to 14. In the description, an example is represented, to which the vibrator 1 using the gyro element 2 is applied.

FIG. 12 is a perspective view illustrating a schematic configuration of a mobile-type (or notebook-type) personal computer as an electronic apparatus that includes the vibrator 1 as an electronic device according to one embodiment of the invention. In FIG. 12, a personal computer 1100 is configured to have a main body section 1104 that includes a keyboard 1102, and a display unit 1106 that includes a display section 1101, and the display unit 1106 is rotatably supported with respect to the main body section 1104 through a hinge structure section. The vibrator 1 using the gyro element 2 that has a function of detecting the angular velocity is equipped in the personal computer 1100.

FIG. 13 is a perspective view illustrating a schematic configuration of a mobile phone (including a PHS) as the electronic apparatus that includes the vibrator 1 as an electronic device according to one embodiment of the invention. In FIG. 13, a mobile phone 1200 includes a plurality of operation buttons 1202, an earpiece 1204, and a mouthpiece 1206. A display section 100 is disposed between the operation buttons 1202 and the earpiece 1204. Such a mobile phone 1200 is equipped with the vibrator 1 using the gyro element 2 that has a function as an angular velocity sensor.

FIG. 14 is a perspective view illustrating a schematic configuration of a digital still camera as an electronic apparatus that includes the vibrator 1 as an electronic device according to one embodiment of the invention. In FIG. 14, connection to an external apparatus is illustrated in a simplified manner. Here, a camera in the related art causes an analog photography film to be photosensitive to an optical image of a subject. In contrast, a digital still camera 1300 performs photoelectric conversion of an optical image of a subject, using an imaging device, such as a charge coupled device (CCD), and generates an imaging signal (image signal).

A display section 100 is provided on the back surface of a case (body) 1302 in the digital still camera 1300, and has a configuration in which a display is performed on the basis of an imaging signal by the CCD, and the display section 100 functions as a finder to display the subject as an electronic image. In addition, a photosensitive unit 1304 that includes an optical lens (imaging optical system), a CCD, or the like is provided on the front surface side (rear surface side in FIG. 14) of the case 1302.

When a photographer checks an image of a subject displayed on the display section 100, and presses a shutter button 1306, an imaging signal of the CCD at the time point is transmitted to and stored in a memory 1308. In addition, in the digital still camera 1300, a video signal output terminal 1312 and an input/output terminal 1314 for data communication are provided on the side surface of the case 1302. As illustrated in FIG. 14, a television monitor 1430 is connected to the video signal output terminal 1312, and a personal computer 1440 is connected to the input/output terminal 1314 for data communication, as necessary. Further, the imaging signal stored in the memory 1308 is configured to be output to the television monitor 1430 or to the personal computer 1440 by a predetermined operation. The vibrator 1 using the gyro element 2 that has a function as an angular velocity sensor is equipped in such a digital still camera 1300.

In addition to applications of the vibrator 1 according to one embodiment of the invention to the personal computer (mobile personal computer) in FIG. 12, to the mobile phone in FIG. 13, and to the digital still camera in FIG. 14, the vibrator 1 according to one embodiment of the invention can be applied to an electronic apparatus, such as an ink jet discharge apparatus (for example, ink jet printer), a laptop personal computer, a TV, a video camera, a video tape recorder, a car navigation device, a pager, an electronic organizer (including a communicating function), an electronic dictionary, a calculator, an electronic game device, a word processor, a workstation, a TV phone, a security television monitor, electronic binoculars, a POS terminal, a medical apparatus (for example, an electronic thermometer, a sphygmomanometer, a blood glucose meter, an electrocardiogram measuring device, an ultrasonic diagnostic apparatus, or an electronic endoscope), a fishfinder, various measurement apparatuses, meters (for example, meters on a vehicle, an aircraft, or a ship), or a flight simulator.

Moving Object

Figure 15:
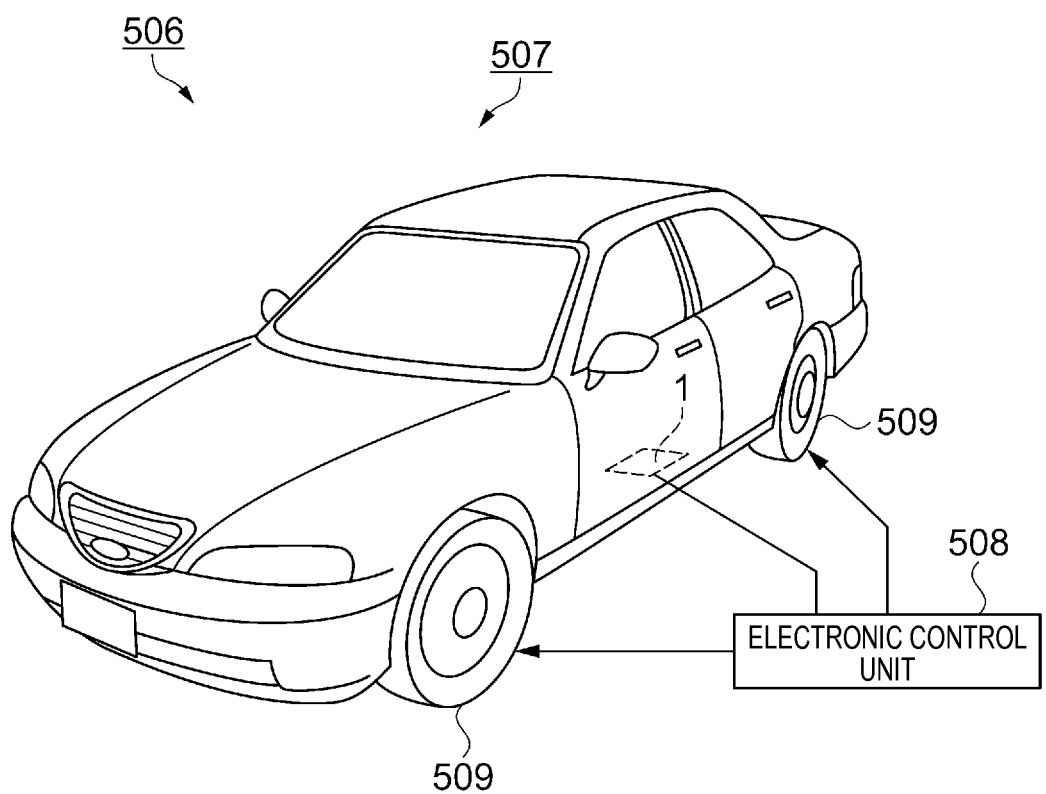
FIG. 15 is a perspective view illustrating a configuration of an automobile as an example of a moving object.

FIG. 15 is a perspective view schematically illustrating an automobile as an example of a moving object. The vibrator 1 as an electronic device according to the invention is mounted on an automobile 506. For example, as illustrated in FIG. 15, an electronic control unit 508 in which the vibrator 1 using the gyro element 2 is equipped and which controls a tire 509 or the like is mounted on a vehicle body 507 in the automobile 506 as the moving object. In addition, the vibrator 1 can be widely applied to an electronic control unit (ECU), such as keyless entry, an immobilizer, a car navigation system, a car air conditioner, an anti-lock brake system (ABS), an airbag, a tire pressure monitoring system (TPMS), an engine control, a battery monitor of a hybrid car or an electric car, or a vehicle body posture control system.

The entire disclosure of Japanese Patent Application No. 2013-226527, filed Oct. 31, 2013 is expressly incorporated by reference herein.

What is claimed is:

1. A manufacturing method of an electronic device that accommodates an electronic component in an inner space formed by a base and a lid body, the manufacturing method comprising:
    preparing the lid body in which a groove is provided on a surface which is welded with the base, the groove having a first opening on an inner space side of the lid body and a second opening on an outer periphery side of the lid body;
    first welding the base and the lid body at a portion excluding an unwelded portion that includes at least a part of the groove, of a planned welding portion of the base and the lid body, in a state in which the inner space has air communication with an outside through the groove; and
    second welding the base and the lid body at the unwelded portion such that the second opening of the groove is closed in a state in which the inner space has no air communication with the outside,
    wherein the first opening has a first width in a plan view, the second opening has a second width in the plan view, and the first width is larger than the second width, and
    part of the groove directly adjacent to the first opening is overlapped with the inner space in the plan view.

2. The manufacturing method of an electronic device according to claim 1, further comprising:
    exhausting air from the inner space to the outside through the groove between the first welding and the second welding.

3. An electronic device that is manufactured, using the manufacturing method according to claim 2.

4. An electronic apparatus comprising:
    an electronic device that is manufactured, using the manufacturing method according to claim 2.

5. A moving object comprising:
    an electronic device that is manufactured, using the manufacturing method according to claim 2.

6. The manufacturing method of an electronic device according to claim 1,
    wherein the groove continuously widens from the second opening on the outer periphery side toward the first opening on the inner space side.

7. An electronic device that is manufactured, using the manufacturing method according to claim 6.

8. An electronic apparatus comprising:
    an electronic device that is manufactured, using the manufacturing method according to claim 6.

9. A moving object comprising:
    an electronic device that is manufactured, using the manufacturing method according to claim 6.

10. The manufacturing method of an electronic device according to claim 1,
    wherein the first opening has a first height, the second opening has a second height, and the first height is larger than the second height.

11. An electronic device that is manufactured, using the manufacturing method according to claim 1.

12. An electronic apparatus comprising:
an electronic device that is manufactured, using the manufacturing method according to claim 1.

13. A moving object comprising:
an electronic device that is manufactured, using the manufacturing method according to claim 1.

14. The manufacturing method of an electronic device according to claim 1,
wherein the groove widens in a stepwise manner from the second opening on the outer periphery side toward the first opening on the inner space side.

15. An electronic device that is manufactured, using the manufacturing method according to claim 14.

16. An electronic apparatus comprising:
an electronic device that is manufactured, using the manufacturing method according to claim 14.

17. A moving object comprising:
an electronic device that is manufactured, using the manufacturing method according to claim 14.

18. The manufacturing method of an electronic device according to claim 1,
wherein the first opening has a first height, the second opening has a second height, and the first height is equal to the second height.

* * * * *